(12) United States Patent
Tachibana et al.

(10) Patent No.: US 7,414,453 B2
(45) Date of Patent: Aug. 19, 2008

(54) LEVEL CONVERSION CIRCUIT

(75) Inventors: Suguru Tachibana, Kawasaki (JP); Tatsuo Kato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/650,485

(22) Filed: Jan. 8, 2007

(65) Prior Publication Data

US 2007/0115041 A1    May 24, 2007

Related U.S. Application Data

(62) Division of application No. 10/948,524, filed on Sep. 24, 2004, now Pat. No. 7,176,740.

(30) Foreign Application Priority Data

Apr. 21, 2004  (JP)  ............................. 2004-125869

(51) Int. Cl.
    *H03L 5/00*   (2006.01)
(52) U.S. Cl. ........................ 327/333; 326/68
(58) Field of Classification Search .................... 327/55, 327/67, 333; 363/63, 68, 82, 83; 326/63, 326/68, 82, 83
    See application file for complete search history.

(56) References Cited

U.S. PATENT DOCUMENTS

| | | | |
|---|---|---|---|
| 4,717,840 A * | 1/1988 | Ouyang et al. ............... | 327/143 |
| 5,461,333 A * | 10/1995 | Condon et al. ............... | 327/208 |
| 5,631,941 A | 5/1997 | Shou et al. | |
| 5,905,402 A | 5/1999 | Kim et al. | |
| 5,959,472 A | 9/1999 | Nagamatsu et al. | |
| 6,011,421 A * | 1/2000 | Jung ........................... | 327/333 |
| 6,373,285 B1 * | 4/2002 | Konishi ........................ | 326/81 |
| 6,483,353 B2 | 11/2002 | Kim et al. | |
| 6,492,850 B2 | 12/2002 | Kato et al. | |
| 6,518,818 B1 | 2/2003 | Hynes | |
| 6,534,806 B1 | 3/2003 | Wert | |
| 6,563,362 B2 * | 5/2003 | Lambert ...................... | 327/333 |
| 6,670,841 B2 | 12/2003 | Kobayashi | |
| 6,680,985 B1 | 1/2004 | Strodtbeck et al. | |
| 6,774,698 B1 | 8/2004 | Bhattacharya et al. | |
| 7,005,908 B2 * | 2/2006 | Lee et al. ..................... | 327/333 |

(Continued)

FOREIGN PATENT DOCUMENTS

JP  06-037624  2/1994

(Continued)

*Primary Examiner*—N. Drew Richards
*Assistant Examiner*—Thomas J Hiltunen
(74) *Attorney, Agent, or Firm*—Arent Fox LLP

(57) ABSTRACT

A level conversion circuit that prevents the operation speed from decreasing when the power supply voltage decreases while appropriately performing level conversion. The level conversion circuit includes first and second PMOS transistors. A first NMOS transistor is connected to the first PMOS transistor and the second PMOS transistor. A second NMOS transistor is connected to the second PMOS transistor and the first PMOS transistor. A bias circuit, connected to the first and second NMOS transistors, generates a bias potential that is supplied to the first and second NMOS transistors and that is greater than the first voltage by a threshold voltage of the first and second NMOS transistors. The bias circuit further controls current, which determines the bias potential and flows to the bias circuit, in accordance with a control signal having the first voltage.

14 Claims, 20 Drawing Sheets

U.S. PATENT DOCUMENTS

| | | |
|---|---|---|
| 2002/0047740 A1 | 4/2002 | Suzuki et al. |
| 2003/0011418 A1 | 1/2003 | Nishimura et al. |
| 2003/0042965 A1 | 3/2003 | Kanno et al. |
| 2004/0207450 A1* | 10/2004 | Ando .................... 327/333 |
| 2005/0275442 A1* | 12/2005 | Honda .................... 327/291 |

FOREIGN PATENT DOCUMENTS

| | | |
|---|---|---|
| JP | 06-204850 | 7/1994 |
| JP | 09-007371 | 1/1997 |
| JP | 2001-274675 | 10/2001 |
| JP | 2001-351393 | 12/2001 |
| JP | 2002-190731 | 7/2002 |
| JP | 2002-198800 | 7/2002 |
| JP | 2003-060496 | 2/2003 |
| JP | 2003-101405 | 4/2003 |

* cited by examiner

LEVEL CONVERSION CIRCUIT

CROSS-REFERENCE TO RELATED APPLICATIONS

This is a Divisional Application, which claims the benefit of U.S. patent application Ser. No. 10/948,524, filed Sep. 24, 2004, now U.S. Pat. No. 7,176,740. The disclosure of the prior application is hereby incorporated herein in its entirety by reference.

BACKGROUND OF THE INVENTION

The present invention relates to a level conversion circuit for shifting a voltage level of an input signal and outputting the resulting signal, and more particularly, to a level conversion circuit that includes a bias circuit for generating a bias potential.

A semiconductor integrated circuit device (LSI), which uses a plurality of power supplies, includes a level conversion circuit for connecting circuits that correspond to different power supply voltages. Such level conversion circuits for connecting circuits corresponding to different power supply voltages include a voltage increasing level conversion circuit and a voltage decreasing level conversion circuit. The voltage increasing level conversion circuit converts a signal of a low power supply voltage circuit into a signal of a high power supply voltage circuit. The voltage decreasing level conversion circuit converts a signal of a high power supply voltage circuit into a signal of a low power supply voltage circuit. The voltage increasing level conversion circuit needs to have the function of amplifying the voltage of a signal. Thus, the voltage increasing level conversion circuit tends to have a longer delay time and consumes greater power than the voltage decreasing level conversion circuit. There is a demand for reducing the delay time and power consumption of level conversion circuits.

For semiconductor integrated circuit devices in recent years, the degree of integration of their digital circuits has been improved along with miniaturization of their integrated circuits. To improve reliability and reduce power consumption of semiconductor integrated circuit devices, their digital circuits tend to use a lower power supply voltage. For example, an integrated circuit manufactured with 0.35 um technology uses a power supply voltage of 3.3 V, and an integrated circuit manufactured with 0.18 um technology uses a power supply voltage of 1.8 V. For semiconductor integrated circuit devices used in controllers of automobiles, there still is a demand for using a power supply voltage of 5 V, which is conventionally used, in their interface circuits. To meet this demand, a large number of presently manufactured LSIs include both an interface circuit operable at a conventional power supply voltage (e.g., 5 V) and an internal circuit operable at a power supply voltage lower than the power supply voltage of the interface circuit. Such LSIs include a level conversion circuit for connecting circuits that operate at different power supply voltages and shifting voltage levels.

Such an LSI that includes a level conversion circuit may not necessarily be an LSI to which a plurality of external power supplies with different voltages are connected. For example, a dynamic RAM (DRAM) or a flash electrically erasable programmable ROM (EEPROM) also uses a plurality of different power supply voltages. To be specific, an internal voltage increasing circuit may generate a voltage higher than an externally provided power supply voltage. This results in a plurality of different power supply voltages being used. Alternatively, an internal voltage decreasing circuit may generate an internal voltage lower than an externally provided power supply voltage. This results in a plurality of different power supply voltages being used.

Japanese Laid-Open Patent Publication Nos. 6-204850 (hereafter referred to as document 1), 2003-101405 (document 2), 2001-351393 (document 3), 2002-190731 (document 4), 2003-60496 (document 5), 2002-198800 (document 6), 2001-274675 (document 7), 9-7371 (document 8), and 6-37624 (document 9) disclose examples of level conversion circuits. A level conversion circuit may also be referred to as a level shift circuit or a level shifter circuit.

FIGS. 1 and 2 show typical conventional level conversion circuits. FIG. 1 shows a level conversion circuit 1, which is disclosed in document 1. FIG. 2 shows a level conversion circuit 2, which is disclosed in document 2.

The following first describes the level conversion circuit 1 of FIG. 1. The level conversion circuit 1 includes high voltage capacity PMOS (P-channel metal oxide semiconductor) transistors PH1 and PH2, high voltage capacity NMOS (N-channel metal oxide semiconductor) transistors NH1 and NH2, low voltage capacity PMOS transistors PL1 and PL2, and low voltage capacity NMOS transistors NL1 and NL2. In FIG. 1, symbols representing the high voltage capacity MOS transistors are circled to differentiate them from the low voltage capacity MOS transistors. In the other drawings in this specification, too, symbols representing high voltage capacity MOS transistors are circled.

The drain of the high voltage capacity NMOS transistor NH1 is connected to the drain of the high voltage capacity PMOS transistor PH1 and to the gate of the high voltage capacity PMOS transistor PH2. The source of the high voltage capacity NMOS transistor NH1 is connected to the ground. The drain of the high voltage capacity NMOS transistor NH2 is connected to the drain of the high voltage capacity PMOS transistor PH2 and to the gate of the high voltage capacity PMOS transistor PH1. The source of the high voltage capacity NMOS transistor NH2 is connected to the ground. The source of each of the PMOS transistors PH1 and PH2 is provided with a power supply voltage Vpp, which is for a high voltage circuit unit.

The low voltage capacity PMOS transistor PL1 and the low voltage capacity NMOS transistor NL1 form an inverter circuit 3. The low voltage capacity PMOS transistor PL2 and the low voltage capacity NMOS transistor NL2 form an inverter circuit 4. An input signal IN is provided to the inverter circuit 3. An output node N10 of the inverter circuit 3 (a connecting point of the MOS transistors PL1 and PL2) is connected to the inverter circuit 4 (the gate of each of the MOS transistors PL2 and NL2). Each of the inverter circuits 3 and 4 is provided with and operated at a power supply voltage Vdd, which is for a digital circuit.

The output node N10 of the inverter circuit 3 is connected to the gate of the high voltage capacity NMOS transistor NH1. An output node N11 of the inverter circuit 4 is connected to the gate of the high voltage capacity NMOS transistor NH2. An output signal OUT is output from a connecting point of the PMOS transistor PH2 and the NMOS transistor NH2.

As one example, the power supply voltage Vdd for a digital circuit may be 1.8 V and the power supply voltage Vpp for a high voltage circuit unit may be 5 V. In this case, the level conversion circuit 1 of FIG. 1 converts an input signal IN having a signal amplitude of 1.8 V into an output signal OUT having a signal amplitude of 5 V.

To be specific, when the input signal IN is at a high (H) level (a potential level of 1.8 V), the output node N10 of the inverter circuit 3 is set at a low (L) level (a potential level of 0

V), and the output node N11 of the inverter circuit 4 is set at an H level. With the output node N10 of the inverter circuit 3 being at the L level, the NMOS transistor NH1 is turned off. With the output node N11 of the inverter circuit 4 being at the H level, the NMOS transistor NH2 is turned on. When the NMOS transistor NH2 is turned on, the output signal OUT is set at the L level. Here, with the PMOS transistor PH2 being off, no stationary current flows through the circuit.

When the input signal IN is at a L level, the output node N10 of the inverter circuit 3 is set at a H level, and the output node N11 of the inverter circuit 4 is set at a L level. Thus, the NMOS transistor NH1 is turned on, and the NMOS transistor NH2 is turned off. With the NMOS transistor NH1 being on, a node N20 between the PMOS transistor PH1 and the NMOS transistor NH1 is set at a L level, and the PMOS transistor PH2 is turned on. With the PMOS transistor PH2 being on and the NMOS transistor NH2 being off, the output signal OUT is set at a H level. Here, with the NMOS transistor NH2 being off, no stationary current flows through the circuit.

The signal amplitude of the node N20 and the signal amplitude of the output signal OUT are set at the power supply voltage Vpp, i.e., at 5 V, which is a relatively high voltage. The power supply voltage Vpp of as high as 5 V is applied to circuit components around the node N20 and to circuit components around the output node of the output signal OUT. This means that the MOS transistors PH1, PH2, NH1, and NH2 need to be high voltage capacity transistors. Typically, the voltage capacity of a MOS transistor is increased by increasing the thickness of its gate oxide. To suppress the short-channel effect caused by an increased thickness of its gate oxide, and to improve its drain voltage capacity, a MOS transistor is required to have a long channel.

The level conversion circuit 1 described above is realized by a simple circuit structure and allows no stationary current to flow through the circuit. As such, the level conversion circuit 1 is widely used.

The following describes the level conversion circuit 2 of FIG. 2. In FIG. 2, components that are the same as the corresponding components of the level conversion circuit 1 of FIG. 1 are given the same reference numerals as those components. The level conversion circuit 2 includes a bias circuit 6, in addition to MOS transistors PH1, PH2, NH1, NH2, PL1, PL2, NL1, and NL2. A bias potential NB generated in the bias circuit 6 is provided to the gate of each of the high voltage capacity NMOS transistors NH1 and NH2. The source of the high voltage capacity NMOS transistor NH1 is connected to the output node N10 of the inverter circuit 3. The source of the high voltage capacity NMOS transistor NH2 is connected to the output node N11 of the inverter circuit 4.

The bias circuit 6 includes a resistor R2 and a high voltage capacity PMOS transistor PH5. The source of the PMOS transistor PH5 is provided with a power supply voltage Vpp, which is for a high voltage circuit unit, via the resistor R2. The gate of the PMOS transistor PH5 is provided with a power supply voltage Vdd, which is for a digital circuit. The drain of the PMOS transistor PH5 is connected to the ground.

The power supply voltage Vdd for a digital circuit is 1.8 V. The power supply voltage Vpp for a high voltage circuit unit is 5 V. The level conversion circuit 2 converts an input signal IN having a signal amplitude of 1.8 V into an output signal OUT having a signal amplitude of 5 V. The bias potential NB generated in the bias circuit 6 is higher than the power supply voltage Vdd by substantially a threshold voltage Vth of the PMOS transistor PH5 (NB=Vdd+Vth). The resistor R2 of the bias circuit 6 functions as a current source of a source follower circuit.

To be specific, when the input signal IN is at a H level (1.8 V), the output node N10 of the inverter circuit 3 is set at a L level (0 V), and the output node N11 of the inverter circuit 4 is set at a H level (1.8 V). As one example, the bias potential NB of the bias circuit 6 may be higher than the power supply voltage Vdd by the threshold voltage (e.g., 0.6 V), i.e., the bias potential NB may be 2.4 V (1.8+0.6 V). In this case, the node N10 is at a L level (0 V), and the bias potential NB is 2.4 V. Thus, the NMOS transistor NH1 is turned on (conducting state). Also, the node N11 is at a H level (1.8 V), and the bias potential NB is 2.4 V. Thus, only a voltage of 0.6 V is applied between the gate and source of the NMOS transistor NH2. The NMOS transistor NH2 is turned off (non-conducting state).

Here, with the NMOS transistor NH1 being on, the node N20 is set at a L level, and the PMOS transistor PH2 is turned on. With the PMOS transistor PH2 being on and the NMOS transistor NH2 being off, the output signal OUT is set at a H level. Here, with the NMOS transistor NH2 being off, no stationary current flows through the circuit.

When the input signal IN is at a L level, the output node N10 of the inverter circuit 3 is set at a H level, and the output node N11 of the inverter circuit 4 is set at a L level. In this case, the node N10 is at a H level (1.8 V) and the bias potential NB is 2.4 V. Thus, only a voltage of 0.6 V is applied between the gate and source of the NMOS transistor NH1. The NMOS transistor NH1 is turned off. Also, the node N111 is set at a L level (0 V), and the bias potential NB is 2.4 V. Thus, the NMOS transistor NH2 is turned on. The output signal OUT is set at a L level. Here, the PMOS transistor PH1 is turned on and the NMOS transistor NH1 is turned off, so that the node N20 is set at a H level (5 V). With the node N20 being at a H level, the PMOS transistor PH2 is turned off. Thus, no stationary current flows through the circuit.

In the level conversion circuit 2, the signal amplitude of the nodes N10 and N20 is limited within a range of 0 to 1.8 V. This means that a voltage equal to or greater than the power supply voltage Vdd for a digital circuit is never applied to the low voltage capacity MOS transistors PL1, PL2, NL1, and NL2. The bias potential is higher than the power supply voltage Vdd by substantially the threshold voltage Vth (i.e., the bias voltage is 2.4 V). This increases the gate-source voltage when the NMOS transistors NH1 and NH2 are turned on, and the level conversion circuit 2 realizes high-speed operation.

As described above, the level conversion circuit 2 is formed by adding the bias circuit 6 and improving the circuit connection of the level conversion circuit 1 of FIG. 1. The level conversion circuit 2 with the above-described structure operates at high speed while maintaining high bias reliability. Further, the level conversion circuit 2 allows no stationary current to flow through the circuit.

SUMMARY OF THE INVENTION

The level conversion circuit 1 of FIG. 1 is realized by a simple circuit structure, and has the level conversion function of converting the input signal IN with the low power supply voltage Vdd into the output signal OUT with the high power supply voltage Vpp. However, the level conversion circuit 1 has the following problems. First, the level conversion circuit 1 occupies a relatively large area. Second, the level conversion circuit 1 has a long delay time and its circuit operation speed is slow when the value of the power supply voltage Vdd is lowered to around the threshold voltage Vth of the high voltage capacity NMOS transistors NH1 and NH2. Document 3 also refers to such a problem that the level conversion circuit occupies a large area.

The following assumes a case in which the level conversion circuit 1 of FIG. 1 shifts the output signal OUT from a H level to a L level. When the output signal OUT is at a H level (5 V), the node N20 having a signal level complementary to the output signal OUT is at a L level (0 V), and the input signal IN is also at a L level. When the input signal IN shifts to a H level (1.8 V), the node N10 is set at a L level, and the node N11 is set at a H level. To shift the output signal OUT from a H level to a L level, a current larger than the current provided from the PMOS transistor PH2 needs to flow through the NMOS transistor NH2. The gate-source voltage of the PMOS transistor PH2 is 5 V, whereas the gate-source voltage of the NMOS transistor NH2 is only 1.8 V. To make the driving current of the NMOS transistor NH2 larger than the driving current of the PMOS transistor PH2, the transistor NH2 needs to have a larger gate width.

As one example, a minimum value of the low power supply voltage Vdd may be 1.2 V, and a maximum value of the threshold voltage Vth of the NMOS transistor NH2 may be 1.2 V. In this case, no matter how much the gate width of the NMOS transistor NH2 is increased, it is impossible to make the driving current of the NMOS transistor NH2 larger than the driving current of the PMOS transistor PH2. In this case, the level conversion circuit 1 fails to operate normally.

The level conversion circuit 2 of FIG. 2, which is realized by a relatively simple structure in which the bias circuit 6 is added and the circuit connection of the level conversion circuit 1 is changed, overcomes the above-described drawback. Documents 3 and 4 also disclose the circuit structure that is the same as the circuit structure of the level conversion circuit 2.

In the level conversion circuit 1 of FIG. 1, the gate of each of the high voltage capacity NMOS transistors NH1 and NH2 is provided with a signal having the low power supply voltage Vdd. Compared with this, in the level conversion circuit 2 of FIG. 2, the source of each of the NMOS transistors NH1 and NH2 is provided with a signal having the power supply voltage Vdd, and the gate of each of the NMOS transistors NH1 and NH2 is provided with the bias potential NB (Vdd+Vth), which is higher than the power supply voltage Vdd by substantially the threshold voltage Vth of the NMOS transistor. With this structure, the level conversion circuit 2 allows almost no stationary current to flow through the circuit, and realizes the level conversion function. Further, the gate-source voltage of each of the NMOS transistors NH1 and NH2 is higher than the power supply voltage Vdd by substantially the threshold voltage Vth. Thus, the level conversion circuit 2 realizes a higher-speed operation. Moreover, the gate-source voltage of each of the NMOS transistors NH1 and NH2 is relatively high. Thus, the level conversion circuit 2 is easily designed to make the driving current of the NMOS transistor NH2 larger than the driving current of the PMOS transistor PH2.

In the level conversion circuit 2 of FIG. 2, however, the bias circuit 6 for generating a bias potential operates at all times. This means that the level conversion circuit 2 consumes current even when the level conversion is unnecessary. For example, when an LSI is manufactured and shipped as a product, the LSI is tested to check whether to satisfy desired characteristics. The testing includes an important item referred to as "IDDQ". The IDDQ is a measurement item of quiescent power supply current. In a complementary metal oxide semiconductor (CMOS) circuit, current flows only at the moment when a signal changes, and almost no current flows in a steady state where a signal is unchanged. In an LSI having a leakage failure or a fixed signal failure, a leakage current or a through current flowing through its CMOS circuit causes a quiescent power supply current to increase. In the testing, a quiescent power supply current is detected, and whether an LSI has a failure or not is determined based on the detection result. Stationary current allowed to flow through the bias circuit 6 lowers the accuracy of the IDDQ measurement, which is an important item for an LSI.

As one example, an LSI may be manufactured with 0.18 um technology and may include a plurality of circuits corresponding to power supply voltages of 1.8, 3.3, and 5 V, respectively. In this LSI, a power supply voltage for its digital circuit may be 1.8 V, a power supply voltage for a large part of its external interface circuit may be 3.3 V, and a power supply voltage only for its analog circuit, which is a small part of the LSI, may be 5 V. In this LSI, a level conversion circuit for converting signal levels is connected between a circuit operable at a power supply voltage of 1.8 V and a circuit operable at a power supply voltage of 5 V. Here, for example, the circuit operable at a power supply voltage of 5 V may be only a small part of the entire LSI. Further, the circuit operable at a power supply voltage of 5 V may actually need to operate only during a specific period.

In this case, it is desirable that the circuit operable at a power supply voltage of 5 V be operated only during a necessary period, and current consumption be minimized during a period where the 5 V circuit does not need to be operated. However, the level conversion circuit 2 of FIG. 2 fails to include a circuit structure for deactivating the bias circuit 6. The level conversion circuit 2 has a problem of unnecessary current consumption.

Document 3 discloses a level conversion circuit that also provides a circuit signal having a low power supply voltage to the source of a high voltage capacity NMOS transistor, and biases the gate potential of the NMOS transistor to a voltage value higher than the low power supply voltage by substantially a threshold voltage of the NMOS transistor. In this way, the level conversion circuit disclosed in document 3 also realizes a high-speed operation. However, document 3 fails to disclose a specific circuit structure of a bias circuit, and naturally fails to disclose a circuit for deactivating the bias circuit at the time of testing.

Document 4 discloses a level conversion circuit including a bias circuit that stops generation of a bias potential based on a control signal. When a low power supply voltage is 1.8 V and a high power supply voltage is 5 V in this level conversion circuit, a control signal for controlling deactivation of the bias circuit has a signal amplitude of 5 V. This is because the bias circuit needs to be formed by a MOS transistor with a voltage capacity of 5 V to generate a bias potential higher than the low power supply voltage.

In the case of an LSI using a plurality of power supplies, a power supply voltage for its digital circuit may be 1.8 V, a power supply voltage for a large part of its external interface circuit may be 3.3 V, and a power supply voltage only for its analog circuit, which is a small part of the LSI, may be 5 V as described above. Further, the analog circuit may be only a small part of the entire LSI, and the analog circuit may actually operate only during a specific period. Such an LSI has already been commercialized. For such an LSI, it is desirable that each circuit operable at a power supply voltage of 5 V be operated only during a necessary period, and current consumption be minimized during a period where each 5 V circuit does not need to be operated. Further, for a level conversion circuit converting a signal with a power supply voltage of 1.8 V into a signal with a power supply voltage of 5 V, and for its bias circuit as well, it is desirable that current consumption be minimized during a standby period where a signal is unchanged.

To be specific, the bias circuit of the level conversion circuit is activated and the bias potential is stabilized before the analog circuit operable at a power supply voltage of 5 V starts its operation. Then, after the signal processing in the analog circuit is completed, a current flowing through the bias circuit is minimized. A digital circuit is typically formed by a circuit block operable at 1.8 V. This means that a signal indicating a state shift of the digital circuit is a 1.8 V signal. As one example, a microprocessor unit (MPU) functioning as a digital circuit may be formed by a circuit block operable at 1.8 V and an AD conversion circuit as an analog circuit may be a circuit operable at 5 V. In this case, a memory control unit (MCU) obtains the timing at which the AD conversion circuit starts its operation, by executing a program. The MCU is required to execute control for increasing current flowing through the bias circuit of the level conversion circuit at the timing when the AD conversion circuit starts its operation. Here, the MCU outputs a control signal with a signal level of 1.8 V. The 1.8 V control signal needs to enable stable control of the bias circuit.

When the control signal for controlling the bias circuit is a 5 V signal as in document 4, a 1.8 V signal needs to be converted into a 5 V signal. For the conversion, the bias circuit of the level conversion circuit needs to be operated. Accordingly, a contradiction arises when the bias circuit is to be controlled using a circuit operable at 1.8 V. In this way, the LSI described above fails to realize stable control.

For the bias circuit in document 4, a 5 V control signal may be externally input via a dedicated control terminal at the time of the IDDQ measurement to stop the flow of current in the bias circuit. However, document 4 fails to disclose a circuit structure for stopping a current in the bias circuit in actual use. In actual use, the power supply voltage changes as time elapses. The bias potential of the bias circuit is required to follow such changes in the power supply voltage. Further, the bias potential changes depending on the coupling capacitance of the gate and source of the MOS transistor in the level conversion circuit. Thus, in actual use where the input and output signals of the level conversion circuit frequently change, it is desirable that an impedance of the bias circuit be lowered by allowing a certain amount of current to flow through the bias current.

The present invention provides a level conversion circuit that appropriately performs level conversion while preventing a decrease in its operation speed, which is caused by a decrease in the power supply voltage.

One aspect of the present invention is a level conversion circuit for receiving an input signal having a first voltage and generating an output signal having a second voltage that is greater than the first voltage. The level conversion circuit is provided with a first PMOS transistor including a drain and a gate. A second PMOS transistor includes a drain and a gate. A first NMOS transistor includes a drain, a gate, and a source. The drain of the first NMOS transistor is connected to the drain of the first PMOS transistor and the gate of the second PMOS transistor. A second NMOS transistor includes a drain, a gate, and a source. The drain of the second NMOS transistor is connected to the drain of the second PMOS transistor and the gate of the first PMOS transistor. A third NMOS transistor includes a gate for receiving the input signal and a drain connected to the source of the first NMOS transistor. A fourth NMOS transistor includes a gate for receiving an inverted input signal and a drain connected to the source of the second NMOS transistor. A bias circuit is connected to the gates of the first and second NMOS transistors. The bias circuit generates a first bias potential that is supplied to the gates of the first and second NMOS transistors and that is greater than the first voltage by a threshold voltage of the first and second NMOS transistors. The bias circuit further controls current, which determines the first bias potential and flows to the bias circuit, in accordance with a control signal having the first voltage.

Another aspect of the present invention is a level conversion circuit for receiving an input signal having a first voltage and generating an output signal having a second voltage that is greater than the first voltage. The level conversion circuit is provided with a first NMOS transistor including a drain and a second NMOS transistor including a drain. A first PMOS transistor includes a drain, a gate, and a source. The drain of the first PMOS transistor is connected to the drain of the first NMOS transistor. The gate of the first PMOS transistor is connected to the drain of the second NMOS transistor. A second PMOS transistor includes a drain, a gate, and a source. The gate of the second PMOS transistor is connected to the drain of the first NMOS transistor, and the drain of the second PMOS transistor is connected to the drain of the second NMOS transistor. A third PMOS transistor includes a drain and a gate. The drain of the third PMOS transistor is connected to the source of the first PMOS transistor. A fourth PMOS transistor includes a drain and a gate. The drain of the fourth PMOS transistor is connected to the source of the second PMOS transistor. A bias circuit is connected to the gates of the third and fourth PMOS transistors. The bias circuit generates a bias potential that is supplied to the gates of the third and fourth PMOS transistors so that currents flowing to the third and fourth PMOS transistors are respectively proportional to currents flowing to the first and second NMOS transistors when a level of the output signal shifts.

Another aspect of the present invention is a level conversion circuit for receiving an input signal having a first voltage and generating an output signal having a second voltage that is greater than the first voltage. The level conversion circuit is provided with a first PMOS transistor including a drain, a gate, and a source. A second PMOS transistor includes a drain, a gate, and a source. A third PMOS transistor includes a drain connected to the source of the first PMOS transistor. A fourth PMOS transistor includes a drain connected to the source of the second PMOS transistor. A first NMOS transistor includes a drain, a gate, and a source. The drain of the first NMOS transistor is connected to the drain of the first PMOS transistor and the gate of the second PMOS transistor. A second NMOS transistor includes a drain, a gate, and a source. The drain of the second NMOS transistor is connected to the drain of the second PMOS transistor and the gate of the first PMOS transistor. A third NMOS transistor includes a gate for receiving the input signal and a drain connected to the source of the first NMOS transistor. A fourth NMOS transistor includes a gate for receiving an inverted input signal and a drain connected to the source of the second NMOS transistor. A first bias circuit is connected to the gates of the first and second NMOS transistors. The first bias circuit generates a first bias potential that is supplied to the gates of the first and second NMOS transistors and that is greater than the first voltage by a threshold voltage of the first and second NMOS transistors. The bias circuit further controls current, which determines the first bias potential and flows to the bias circuit, in accordance with a control signal having the first voltage. A second bias circuit is connected to the gates of the third and fourth PMOS transistors. The second bias circuit generates a second bias potential that is supplied to the gates of the third and fourth PMOS transistors so that current flowing to the third and fourth PMOS transistors is proportional to current flowing to the first and second NMOS transistors when a signal level of the output signal shifts.

A further aspect of the present invention is a level conversion circuit for receiving an input signal having a first voltage and generating an output signal having a second voltage that is greater than the first voltage. The level conversion circuit is provided with cross-coupled first and second PMOS transistors. A first NMOS transistor is connected to the first PMOS transistor. A second NMOS transistor is connected to the second PMOS transistor. A third NMOS transistor is connected to the first NMOS transistor and includes a gate for receiving the input signal. A fourth NMOS transistor is connected to the second NMOS transistor and includes a gate for receiving the input signal. A bias circuit is connected to the gates of the first and second NMOS transistors. The bias circuit generates a bias potential that is supplied to the gates of the first and second NMOS transistors and that is greater than the first voltage by a threshold voltage of the first and second NMOS transistors. The bias circuit further controls current, which determines the bias potential and flows to the bias circuit, in accordance with a control signal having the first voltage.

Another aspect of the present invention is a level conversion circuit for receiving an input signal having a first voltage and generating an output signal having a second voltage that is greater than the first voltage. The level conversion circuit includes a bias circuit for generating a bias potential and cross-coupled first and second PMOS transistors. A third PMOS transistor connected to the bias circuit and the first PMOS transistor restricts current flowing to the first PMOS transistor in accordance with the bias potential. A fourth PMOS transistor connected to the bias circuit and the second PMOS transistor restricts current flowing to the second PMOS transistor in accordance with the bias potential. The bias circuit generates a bias potential so that currents flowing to the third and fourth PMOS transistors are respectively proportional to currents flowing to the first and second NMOS transistors when a signal level of the output signal shifts.

A further aspect of the present invention is a level conversion circuit for receiving an input signal having a first voltage and generating an output signal having a second voltage that is greater than the first voltage. The level conversion circuit is provided with a first PMOS transistor including a drain and a gate. A second PMOS transistor includes a drain and a gate. A first NMOS transistor includes a drain, a gate, and a source. The drain of the first NMOS transistor is connected to the drain of the first PMOS transistor and the gate of the second PMOS transistor. A second NMOS transistor includes a drain, a gate, and a source. The drain of the second NMOS transistor is connected to the drain of the second PMOS transistor and the gate of the first PMOS transistor. A third NMOS transistor includes a gate for receiving the input signal and a drain connected to the source of the first NMOS transistor. A fourth NMOS transistor includes a gate for receiving an inverted input signal and a drain connected to the source of the second NMOS transistor. A bias circuit is connected to the gates of the first and second NMOS transistors. The bias circuit is provided with a third PMOS transistor including a drain, a gate, and a source. The source of the third PMOS transistor is supplied with the second voltage. The drain of the third PMOS transistor is connected to the gates of the first and second NMOS transistors. A fourth PROS transistor includes a source connected to the source of the third PMOS transistor and supplied with the second voltage, a gate connected to the gate of the third PMOS transistor, and a drain connected to the gate of the fourth PMOS transistor. A fifth NMOS transistor includes a source supplied with the first voltage, a drain connected to the drain of the third PMOS transistor, and a gate connected to the drain of the fifth NMOS transistor. A sixth NMOS transistor includes a source supplied with a reference voltage, a gate for receiving a control signal having the first voltage, and a drain connected to the drain of the fourth PMOS transistor. A resistor is connected between the drain of the fourth PMOS transistor and the drain of the sixth NMOS transistor.

Another aspect of the present invention is a level conversion circuit for receiving an input signal having a first voltage and generating an output signal having a second voltage that is greater than the first voltage. The level conversion circuit is provided with a first NMOS transistor including a drain. A second NMOS transistor includes a drain. A first PMOS transistor includes a drain, a gate, and a source. The drain of the first PMOS transistor is connected to the drain of the first NMOS transistor, and the gate of the first PMOS transistor is connected to the drain of the second NMOS transistor. A second PMOS transistor includes a drain, a gate, and a source. The gate of the second PMOS transistor is connected to the drain of the first NMOS transistor, and the drain of the second PMOS transistor is connected to the drain of the second NMOS transistor. A third PMOS transistor includes a drain and a gate. The drain of the third PMOS transistor is connected to the source of the first PMOS transistor. A fourth PMOS transistor includes a drain and a gate. The drain of the fourth PMOS transistor is connected to the source of the second PMOS transistor. A bias circuit is connected to the third and fourth PMOS transistors. The bias circuit is provided with a fifth PMOS transistor including a source supplied with the second voltage, a gate connected to the gates of the third and fourth PMOS transistors, and a drain connected to the gate of the fifth PMOS transistor. A third NMOS transistor includes a source supplied with a reference voltage, a gate for receiving a control signal having the first voltage, and a drain connected to the drain of the fifth PMOS transistor.

A further aspect of the present invention is a semiconductor integrated circuit device including a level conversion circuit for receiving an input signal having a first voltage and generating an output signal having a second voltage that is greater than the first voltage. A control circuit connected to the level conversion circuit generates a control signal provided to the level conversion circuit and having the first voltage. The level conversion circuit is provided with a first PMOS transistor including a drain and a gate. A second PMOS transistor includes a drain and a gate. A first NMOS transistor includes a drain, a gate, and a source. The drain of the first NMOS transistor is connected to the drain of the first PMOS transistor and the gate of the second PMOS transistor. A second NMOS transistor includes a drain, a gate, and a source. The drain of the second NMOS transistor is connected to the drain of the second PMOS transistor and the gate of the first PMOS transistor. A third NMOS transistor includes a gate for receiving the input signal and a drain connected to the source of the first NMOS transistor. A fourth NMOS transistor includes a gate for receiving an inverted input signal and a drain connected to the source of the second NMOS transistor. A bias circuit is connected to the gates of the first and second NMOS transistors. The bias circuit generates a bias potential that is supplied to the gates of the first and second NMOS transistors and that is greater than the first voltage by a threshold voltage of the first and second NMOS transistors. The bias circuit further controls current, which determines the bias potential and flows to the bias circuit, in accordance with a control signal having the first voltage.

Another aspect of the present invention is an AD conversion circuit including a comparator for receiving an analog signal and generating a digital signal. A comparison control circuit connected to the comparator generates an input signal having a first voltage in accordance with the digital signal. A level conversion circuit connected to the comparison control circuit receives the input signal having a first voltage and generates an output signal having a second voltage that is greater than the first voltage and used by the AD conversion circuit. The level conversion circuit is provided with a first PMOS transistor including a drain and a gate. A second PMOS transistor includes a drain and a gate. A first NMOS transistor includes a drain, a gate, and a source. The drain of the first NMOS transistor is connected to the drain of the first PMOS transistor and the gate of the second PMOS transistor. A second NMOS transistor includes a drain, a gate, and a source. The drain of the second NMOS transistor is connected to the drain of the second PMOS transistor and the gate of the first PMOS transistor. A third NMOS transistor includes a gate for receiving the input signal and a drain connected to the source of the first NMOS transistor. A fourth NMOS transistor includes a gate for receiving an inverted input signal and a drain connected to the source of the second NMOS transistor. A bias' circuit is connected to the gates of the first and second NMOS transistors. The bias circuit generates a bias potential that is supplied to the gates of the first and second NMOS transistors and that is greater than the first voltage by a threshold voltage of the first and second NMOS transistors. The bias circuit further controls current, which determines the bias potential and flows to the bias circuit, in accordance with a control signal having the first voltage.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 3:
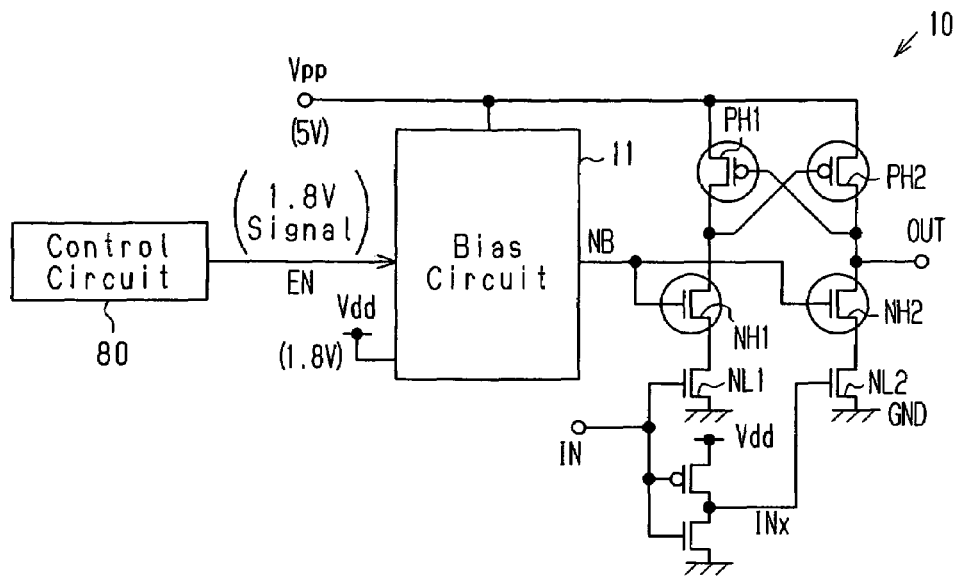
FIG. 3 is a schematic diagram describing a first example of the principle of the present invention.

FIG. 3 is a diagram describing a first example of the principle of the present invention. A level conversion circuit 10 includes first and second PMOS transistors PH1 and PH2, first to fourth NMOS transistors NH1, NH2, NL1, and NL2, and a bias circuit 11. The level conversion circuit 10 converts an input signal IN, which has a signal level that oscillates between a reference voltage GND and a first power supply voltage Vdd, into an output signal OUT, which has a signal level that oscillates between the reference voltage GND and a power supply voltage Vpp higher than the first power supply voltage Vdd. In the level conversion circuit 10, the drain of the first NMOS transistor NH1 is connected to the drain of the first PMOS transistor PH1 and to the gate of the second PMOS transistor PH2. The source of the first NMOS transistor NH1 is connected to the drain of the third NMOS transistor NL1. The drain of the second NMOS transistor NH2 is connected to the drain of the second PMOS transistor PH2 and to the gate of the first PMOS transistor PH1. The source of the second NMOS transistor NH2 is connected to the drain of the fourth NMOS transistor NL2. The gate of the third NMOS transistor NL1 is provided with an input signal IN. The gate of the fourth NMOS transistor NL2 is provided with a signal INX obtained by inverting the input signal IN. The bias circuit 11 provides the gate of each of the NMOS transistors NH1 and NH2 with a bias potential NB, which is higher than the first voltage Vdd by a threshold voltage of the NMOS transistors NH1 and NH2. This enables the level conversion circuit 10 to operate at high speed even when the first voltage Vdd is lowered to the threshold voltage of the NMOS transistor. The bias circuit 11 is connected to a control circuit 80. The control circuit 80 generates a control signal EN with the first voltage Vdd (e.g., 1.8 V), which is lower than the second voltage Vpp (e.g., 5 V). The bias current of the bias circuit 11 is controlled based on the control signal EN. To be specific, the control for lowering an impedance of the bias circuit 11, which generates a bias potential NB, is executed based on the control signal EN during a period where the input and output signals of the level conversion circuit 10 frequently change. The control is executed using a low-voltage circuit (a circuit operable at the first voltage Vdd).

Figure 4:
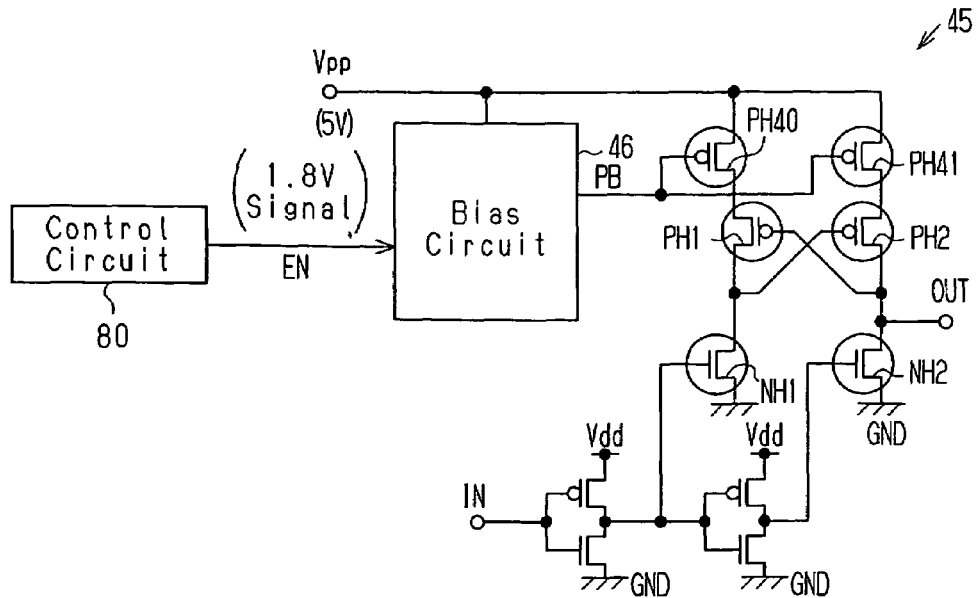
FIG. 4 is a schematic diagram describing a second example of the principle of the present invention.

FIG. 4 is a diagram describing a second example of the principle of the present invention. A level conversion circuit 45 includes first to fourth PMOS transistors PH1, PH2, PH40, and PH41, first and second NMOS transistors NH1 and NH2, and a bias circuit 46. The level conversion circuit 45 converts an input signal IN, which has a signal level between a reference voltage GND and a first power supply voltage Vdd, into an output signal OUT, which has a signal level between the reference voltage GND and a second power supply voltage Vpp higher than the first power supply voltage Vdd. In the level conversion circuit 45, the drain of the first NMOS transistor NH1 is connected to the drain of the first PMOS transistor PH1 and to the gate of the second PMOS transistor PH2. The drain of the second NMOS transistor NH2 is connected to the drain of the second PMOS transistor PH2 and to the gate of the first PMOS transistor PH1. The drain of the third PMOS transistor PH40 is connected to the source of the first PMOS transistor PH1. The drain of the fourth PMOS transistor PH41 is connected to the source of the second PMOS transistor PH2. The bias circuit 46 is connected to a control circuit 80, which generates a control signal EN. The bias circuit 46 provides the gate of each of the third and fourth PMOS transistors PH40 and PH41 with a bias potential PB, so that a current flowing through the third and fourth PMOS transistors PH40 and PH41 is proportional to a current flowing through the first and second NMOS transistors NH1 and NH2 when the level of the output signal OUT changes. The PMOS transistors PH40 and PH41 for current limiting are respectively connected in series to the PMOS transistors PH1 and PH2, which are cross-coupled. This enables the level conversion circuit 45 to be designed to satisfy conditions required to shift an output signal OUT from a H level to a L level. In other words, this enables the current flowing through the NMOS transistor NH2 to be made larger than the current flowing through the PMOS transistor PH2, without increasing a gate width W of the NMOS transistor NH2.

In the level conversion circuit 10 of FIG. 3, the bias circuit 11 includes a resistor for setting the bias current, and a MOS transistor for controlling a current flowing through the resistor based on a control signal. This structure enables the level conversion circuit 10 to allow and stop a bias current flowing through the bias circuit by controlling on and off of the MOS transistor based on a control signal.

In this level conversion circuit, the bias circuit includes a plurality of resistors for setting the bias current. Thus, the bias current is appropriately set not only at a value required during operation but also at a value required during standby.

Figure 5:
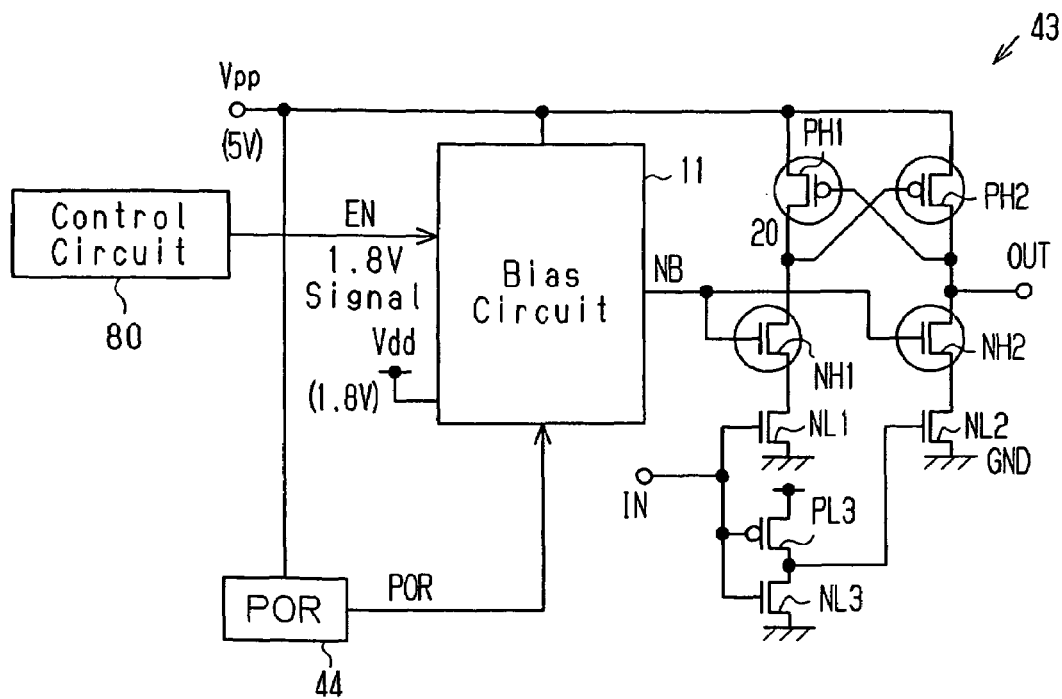
FIG. 5 is a schematic diagram describing a third example of the principle of the present invention.
Figure 6:
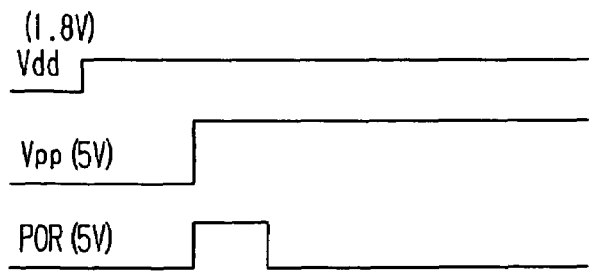
FIG. 6 is an operation waveform diagram of the level conversion circuit of FIG. 5.

FIG. 5 is a diagram describing a third example of the principle of the present invention. A level conversion circuit 43 includes a power-on reset circuit 44. FIG. 6 is an operation waveform diagram of the level conversion circuit 43. As shown in FIG. 6, the power-on reset circuit 44 detects the rise of the second voltage Vpp, and provides the bias circuit 11 with a reset signal POR, to increase the bias current flowing through the bias circuit 11. An increase in the bias current accelerates charging of the bias potential NB. This minimizes a period where the output signal OUT of the level conversion circuit 43 is undetermined at the rise of the power supply voltage Vpp.

In the bias circuit 46 shown in FIG. 4, a MOS transistor for switching purposes sets the bias potential PB at a potential level of the reference voltage GND when the bias current is stopped. Here, the third and fourth PMOS transistors PH40 and PH41 are turned on based on the bias potential PB. Thus, the output signal OUT is determined even when the bias current is stopped.

This level conversion circuit includes a capacitor for stabilizing the bias potential, and provides a desirable bias potential with reduced potential changes.

First Embodiment

The following describes a level conversion circuit 10 according to a first embodiment of the present invention.

Figure 2:
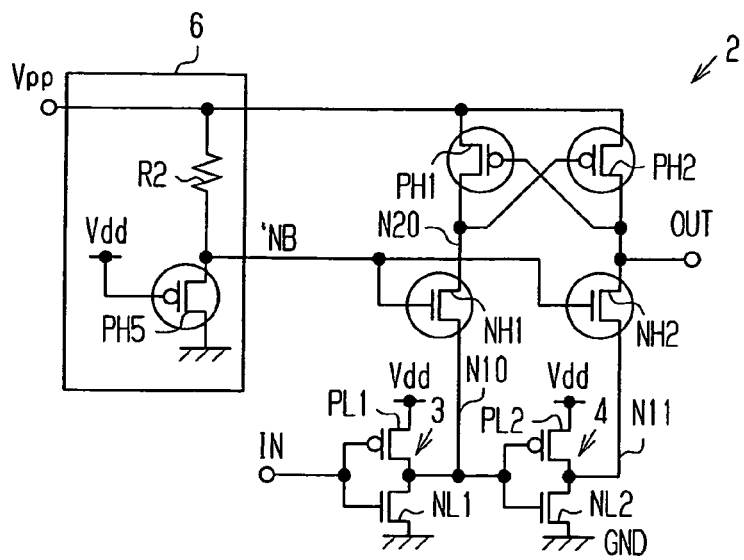
FIG. 2 is a schematic circuit diagram showing a level conversion circuit according to a second conventional example.
Figure 7:
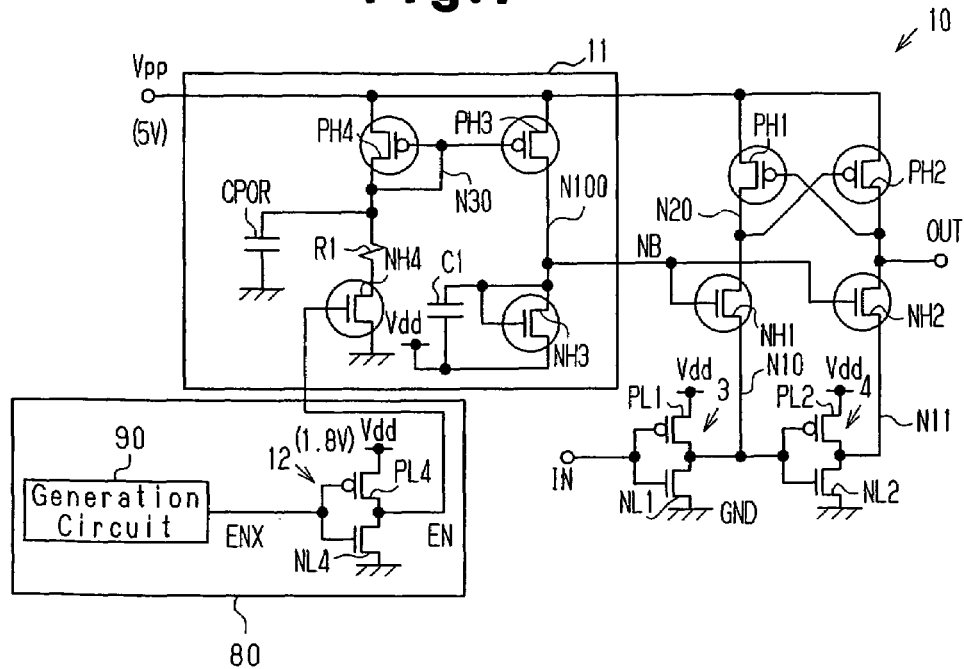
FIG. 7 is a schematic circuit diagram showing a level conversion circuit according to a first embodiment of the present invention.

FIG. 7 shows the level conversion circuit 10 according to the first embodiment. The level conversion circuit 10 includes a bias circuit 11 for generating a bias potential NB. The bias circuit 11 differs from the corresponding component of the conventional example shown in FIG. 2. In FIG. 7, components that are the same as the corresponding components of the conventional example in FIG. 2 (the MOS transistors PH1, PH2, NH1, and NH2, the inverter circuits 3 and 4, etc.,) are given the same reference numerals as those components.

The level conversion circuit 10 converts an input signal IN, which has a signal level that oscillates between a reference voltage of 0 V and a power supply voltage Vdd of 1.8 V, into an output signal OUT, which has a signal level that oscillates between the reference voltage GND of 0 V and a second power supply voltage Vpp of 5 V. The bias circuit 11 generates a bias potential NB. The bias potential NB (Vdd+Vth) is higher than the power supply voltage Vdd (e.g., 1.8 V) for a digital circuit by a threshold voltage Vth of the high voltage capacity NMOS transistor. The bias circuit 11 provides the gate of each of the transistors NH1 and NH2 with the bias potential NB.

The following describes the operation of the level conversion circuit 10 when the bias circuit 11 generates the bias potential NB of Vdd+Vth. As one example, the threshold voltage Vth may be 0.8 V, and the bias potential NB may be 2.6 V (1.8+0.8 V).

When the input signal IN is at a H level (1.8 V), the output node N10 of the inverter circuit 3 is at a L level (0 V), and the bias potential NB is 2.6 V. Thus, the NMOS transistor NH1 is turned on. The output node N11 of the inverter circuit 4 is at a H level (1.8 V), and the bias potential NB is 2.6 V. Thus, only a voltage of 0.8 V is applied between the gate and source of the NMOS transistor NH2. With the gate-source voltage being 0.8 V and the threshold voltage Vth being 0.8 V, the transistor NH2 is turned off.

When the NMOS transistor NH1 is turned on, the node N20 (the connecting point of the PMOS transistor PH1 and the NMOS transistor NH1) is set at a L level (0 V), and the PMOS transistor PH2 is turned on. With the PMOS transistor PH2 being on and the NMOS transistor NH2 being off, the output signal OUT is set at a H level (5 V). Here, with the NMOS transistor NH2 being off, no stationary current flows through this part of the circuit.

When the input signal IN is at a L level, the output node N10 of the inverter circuit 3 is set at a H level, and the output node N11 of the inverter circuit 4 is set at a L level. The output node N10 of the inverter circuit 3 is at a H level (1.8 V), and the bias potential NB is 2.6 V. Thus, only a voltage of 0.8 V is applied between the gate and source of the NMOS transistor NH1. The NMOS transistor NH1 is turned off. The output node N11 of the inverter circuit 4 is at a L level (0 V), and the bias potential NB is 2.6 V. The NMOS transistor NH2 is turned on.

When the NMOS transistor NH2 is turned on, the output signal OUT is set at a L level (0 V), and the PMOS transistor PH1 is turned on. With the PMOS transistor PH1 being on and the NMOS transistor NH1 being off, the node N20 is set at a H level (5 V). With the node N20 being set at a H level, the PMOS transistor PH2 is turned off. No stationary current flows through this part of the circuit.

The signal amplitude at each of the nodes N10 and N11 is limited within a range of 0 to 1.8 V. Thus, a voltage equal to or greater than the power supply voltage Vdd (1.8 V) for a digital circuit unit is never applied to the low voltage capacity MOS transistors PL1, PL2, NL1, and NL2. The bias potential NB generated in the bias circuit 11 is a voltage (2.6 V) higher than the power supply voltage Vdd by the threshold voltage Vth. Thus, the level conversion circuit 10 realizes high-speed operation.

The following describes the structure of the bias circuit 11 of the first embodiment in detail.

The bias circuit 11 includes high voltage capacity PMOS transistors PH3 and PH4, high voltage capacity NMOS transistors NH3 and NH4, a resistor R1, and capacitors C1 and CPOR. In the bias circuit 11, the source of each of the high voltage capacity PMOS transistors PH3 and PH4 is provided with the power supply voltage Vpp (e.g., 5 V). The gate of the PMOS transistor PH3 and the gate of the PMOS transistor PH4 are connected to each other, and are connected to the drain of the PMOS transistor PH4. In other words, the PMOS transistor PH3 and PH4 form a current mirror circuit.

The drain of the PMOS transistor PH4 is connected to the drain of the NMOS transistor NH4 via the resistor R1, and is also connected to the ground via the capacitor CPOR. The source of the NMOS transistor NH4 is connected to the ground. A control circuit 80 is connected to the bias circuit 11. The control circuit 80 includes a generation circuit 90 for generating a control signal ENX, and an inverter circuit 12 connected to the generation circuit 90. The gate of the NMOS transistor NH4 is provided with an enable control signal EN via the inverter circuit 12. The inverter circuit 12 is a CMOS inverter circuit including a low voltage capacity PMOS transistor PL4 and a low voltage capacity NMOS transistor NL4. The inverter circuit 12 is provided with and operated at the power supply voltage Vdd of 1.8 V. The inverter circuit 12 generates the control signal EN by inverting the control signal ENX.

In the bias circuit 11, the high voltage capacity NMOS transistor NH3 is connected in series to the high voltage capacity PMOS transistor PH3. The source of the NMOS transistor NH3 is provided with the power supply voltage Vdd of 1.8 V. The gate of the NMOS transistor NH3 is connected to the drain of the NMOS transistor NH3. In other words, the NMOS transistor NH3 is diode-connected. The capacitor C1 is connected in parallel with the diode-connected NMOS transistor NH3. The NMOS transistors NH1 and NH2 are provided with a bias potential NB, which is generated at the node N100 connecting the drains of the MOS transistors PH3 and NH3.

The following describes the operation of the bias circuit 11 with the above-described structure.

First, the inverter circuit 12 is provided with a L level (0 V) control signal ENX. The inverter circuit 12 generates a H level (1.8 V) control signal EN by inverting the signal level of the control signal ENX, and provides the bias circuit 11 with the control signal EN. Then, the NMOS transistor NH4 is turned on. The potential of the node N30 is set at a L level, the PMOS transistor PH4 is turned on, and current flows through the resistor R1 and the PMOS transistor PH4. Then, current also flows through the PMOS transistor PH3 that is connected to form a current mirror circuit together with the PMOS transistor PH4. The current further flows through the power supply with the low power supply voltage Vdd (digital circuit) via the diode-connected NMOS transistor NH3. The bias potential NB of the bias circuit 11 is higher than the power supply voltage Vdd by substantially a threshold voltage Vth of the high voltage capacity NMOS transistor NH3. The value of a current flowing through the NMOS transistor NH3 is set by the resistor R1. Also, the capacitor C1 functions as a stabilizing capacitor for preventing changes in the bias potential NB.

When the control signal EN is at a L level, the NMOS transistor NH4 is turned off. Thus, no current flows through the resistor R1, the PMOS transistor PH4, and the PMOS transistor PH3. With no current flowing through the PMOS transistor PH3, almost no current flows through the NMOS transistor NH3 as well. In this case, the value of the bias potential NB is determined by a leakage current flowing through the NMOS transistor NH3. The bias potential NB in this case is lower compared with when the control signal EN is at a H level, and is higher than the power supply voltage Vdd.

The power supply voltage Vdd may change with time, and the bias potential NB needs to follow such changes. Also, the gate-source coupling of the NMOS transistors NH1 and NH2 causes the bias potential NB to change. Thus, in a state where the input and output signals of the level conversion circuit 10 frequently change, it is desirable to lower an impedance of the bias circuit 11, which generates the bias potential NB. An impedance of the bias circuit 11 is lowered by allowing a certain amount of current to flow through the bias circuit 11. This enables the bias potential NB to follow changes in the power supply voltage Vdd.

An amount of current flowing through the bias circuit 11 is changed by controlling on and off of the NMOS transistor NH4 based on the control signal EN. To be specific, the NMOS transistor NH4 is turned on in a state where the input and output signals of the level conversion circuit 10 frequently change. The NMOS transistor NH4 is turned off in a state where the input and output signals are unchanged. With such control, a current is allowed to flow through the bias circuit 11 only during a period where an impedance of the bias circuit 11 for generating the bias potential NB needs to be lowered.

As described above, the gate of the NMOS transistor NH4 is provided with the power supply voltage Vdd for a low voltage circuit (digital circuit) unit in the first embodiment. In this case, the level conversion circuit 10 is to be designed so that the on resistance of the NMOS transistor NH4 is smaller than the resistance of the resistor R1. Such designing enables the on and off control of the bias circuit 11 to be executed based on the control signal EN with the low power supply voltage Vdd.

An equivalent impedance of the bias circuit 11 for generating the bias potential NB is lowered by increasing an amount of current flowing through the bias circuit 11 when the control signal ENX is at a low level, i.e., when the control signal EN is at a H level. This enables the bias potential NB to follow changes in the power supply voltage Vdd.

The capacitor CPOR functions as a power-on reset circuit for generating a power-on reset signal at the rise of the 5 V power supply voltage Vpp. The capacitor CPOR accelerates the rise of the bias potential NB when power is turned on.

Power-on procedures of the level conversion circuit 10 is normally predetermined to enable its output to be determined at all times. As one example, the power supply voltage Vpp of 5 V may rise first, and then the power supply voltage Vdd of 1.8 V may rise. In this case, there exists a state where the power supply voltage Vpp is 5 V and the power supply voltage Vdd is 0 V. In this state, each of the output nodes N10 and N11 is set at 0 V. The output of the level conversion circuit 10 is undetermined. This state is undesirable because a current may flow through the NMOS transistors NH1 and NH2 depending on the value of the bias potential NB.

As another example, the power supply voltage Vdd of 1.8 V first may first rise, and then the power supply voltage Vpp of 5 V may rise. In this case, even in a state where the power supply voltage Vpp is 0 V and the power supply voltage Vdd is 1.8 V, the output of the level conversion circuit 10 is determined (the output is determined as 0 V because the power supply voltage Vpp is 0 V). In this case, it is desirable that an internal potential of the level conversion circuit 10 be determined and its output be determined immediately after the 5 V power supply voltage Vpp rises.

If the rise of the bias potential NB in the bias circuit 11 is slow, there may exist a state where the power supply voltage Vpp is 5 V and the power supply voltage Vdd is 1.8 V, and the bias potential NB is a low potential not reaching its final value (a potential of less than 2.6). In this state, the bias potential NB is low even when a L level or H level input signal IN is input and the signal level of the nodes N10 and N11 is determined. The transistors NH1 and NH2 are not sufficiently turned on. The level conversion circuit 10 fails to operate normally. As a result, the level of the output signal OUT is undetermined.

To avoid such an undesirable state, the bias circuit 11 in the first embodiment includes the capacitor CPOR. Immediately after the 5 V power supply voltage Vpp rises, the capacitor CPOR sets the potential of the node N30 in the bias circuit 11 (the gate potential of each of the PMOS transistors PH3 and PH4) at 0 V. This causes a large amount of current to flow through each of the PMOS transistors PH3 and PH4. With a large amount of current flowing through the PMOS transistor PH3, the bias potential NB promptly approaches its final value. Here, the capacitor CPOR is charged, the potential of the node N30 increases, and the current flowing through each of the PMOS transistors PH3 and PH4 gradually decreases. Finally, the potential of the node N30 is set at a value smaller than the power supply voltage Vpp by substantially the threshold voltage Vth of the PMOS transistor PH4. Thus, only a current as small as a leakage current flows through the transistor PH3.

In this way, the capacitor CPOR functioning as a power-on reset circuit enables the bias potential NB to be promptly set at its final target value. This minimizes a period where the output of the level conversion circuit 10 is undetermined (the output is unpredictable). In the first embodiment, the circuit including the capacitor CPOR is exemplified. However, when a parasitic capacitance or the like enables the bias potential NB to rise sufficiently fast, the level conversion circuit may not include the capacitor CPOR.

In the level conversion circuit 10 of the first embodiment, the source of each of the PMOS transistors PH1 and PH2 is provided with the power supply voltage Vpp, the drain of the transistor PH1 and the gate of the transistor PH2 share a common potential, and the drain of the transistor PH2 and the gate of the transistor PH1 share a common potential. Instead of the PMOS transistors PH1 and PH2 connected in this way, the level conversion circuit 10 may include another circuit functioning as a positive feedback circuit.

The level conversion circuit 10 of the first embodiment has the advantages described below.

(1) In the bias circuit 11, the source of the diode-connected NMOS transistor NH3 is connected to the power supply with the power supply voltage Vdd. The bias potential NB (2.6 V) higher than the power supply voltage Vdd by the threshold voltage Vth is generated by allowing a current to flow through the NMOS transistor NH3. The gate of each of the NMOS transistors NH1 and NH2 is provided with the bias potential NB. In this way, the level conversion circuit 10 realizes a high-speed operation. The bias circuit 11 includes the NMOS transistor NH4 that functions as a switch, and the resistor R1 that determines a current. The bias circuit 11 is turned on and off by the NMOS transistor NH4. By controlling on and off of the NMOS transistor NH4 based on the control signal EN with the low power supply voltage Vdd, an amount of current flowing through the bias circuit 11 is changed. In other words, in the level conversion circuit 10, the bias potential NB is controlled by the circuit operable at the low power supply voltage Vdd. As one example, a CPU may be used as a circuit block operable at the low power supply voltage Vdd. In this case, the CPU outputs the control signal EN by executing a problem, and allows a current to flow through the bias circuit 11, which generates the bias potential NB, only during a period where an impedance of the bias circuit 11 needs to be lowered (a period where the input and output signals of the level conversion circuit 10 frequently change).

(2) The bias circuit 11 includes the capacitor CPOR, which functions as a power-on reset circuit. This enables the bias potential NB to be promptly set at its final target value. This minimizes a period where the output of the level conversion circuit 10 is undetermined.

(3) The bias circuit 11 includes the capacitor C1, which functions as a stabilizing capacitor. This enables the NMOS transistors NH1 and NH2 to be provided with a desirable bias potential with almost no potential changes.

Second Embodiment

An AD conversion circuit 15 according to a second embodiment of the present invention will now be described with reference to the drawings.

Figure 8:
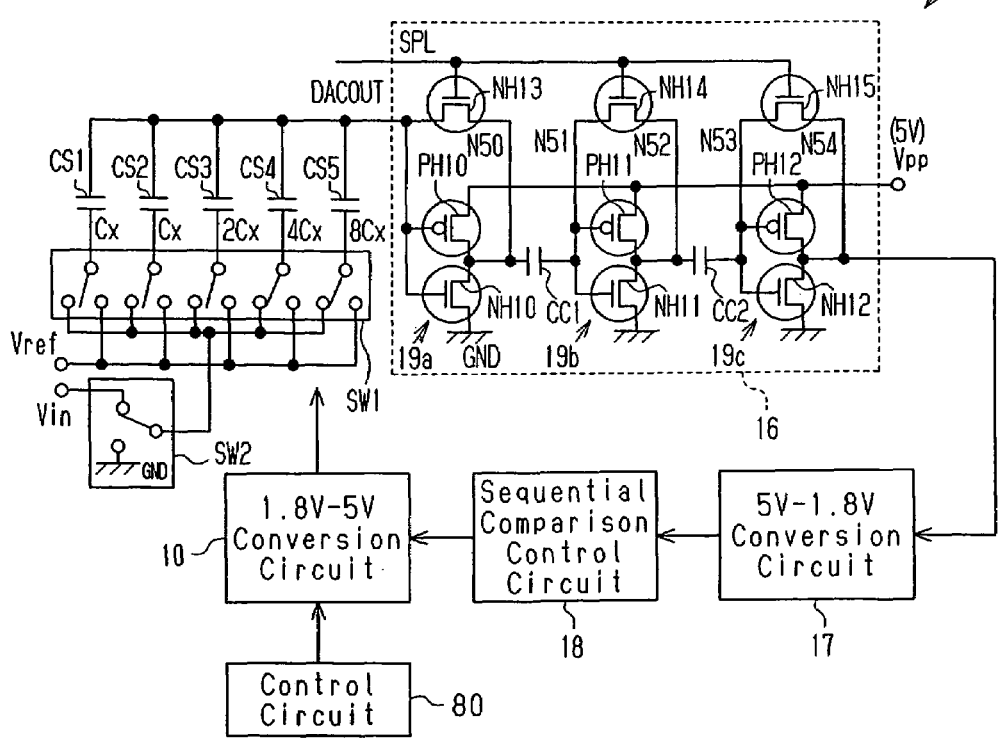
FIG. 8 is a schematic circuit diagram showing an AD conversion circuit according to a second embodiment of the present invention.

FIG. 8 shows the AD conversion circuit 15, which includes the level conversion circuit 10 of the first embodiment.

The AD conversion circuit 15 according to the second embodiment is a sequential comparison AD conversion circuit for converting an analog signal Vin into a 4-bit digital signal. The AD conversion circuit 15 is used, for example, in a semiconductor integrated circuit device (LSI) for automobiles. The AD conversion circuit 15 includes, in addition to the level conversion circuit 10, first and second switch circuits SW1 and SW2, sampling capacitors CS1, CS2, CS3, CS4, and CS5, a comparator 16, a level conversion circuit 17, and a sequential comparison control circuit 18.

Capacitance values of the sampling capacitors CS1 to CS5 are binary-weighted values. The capacitor values are set at a ratio of 1:1:2:4:8. To be specific, each of the capacitors CS1 and CS2 is formed by one unit capacitor Cx, the capacitor CS3 by two unit capacitors Cx, the capacitor CS4 by four unit capacitors Cx, and the capacitor CS5 by eight unit capacitors Cx. In other words, the sampling capacitors CS1 to CS5 are formed by 16 capacitors in total.

A first terminal of each of the sampling capacitors CS1 to CS5 is connected to the comparator 16. A second terminal of each of the sampling capacitors CS1 to CS5 is connected to the first switch circuit SW1. The first switch circuit SW1 is connected to the second switch circuit SW2. Each of the switch circuits SW1 and SW2 is switched based on a control signal provided from the level conversion circuit 10, so that each of the sampling capacitors CS1 to CS5 is provided with one of a reference potential Vref, an analog signal Vin, and a potential of the ground (GND). The analog signal Vin has a signal level that oscillates between the reference potential Vref and the GND level.

The comparator 16 includes high voltage capacity PMOS transistors PH10, PH11, and PH12, high voltage capacity NMOS transistors NH10, NH11, NH12, NH13, NH14, and NH15, and coupling capacitors CC1 and CC2. In the comparator 16, the PMOS transistor PH10 and the NMOS transistor NH10 are connected in series, to form a CMOS inverter circuit 19a of the first stage. The NMOS transistor NH13 is connected in parallel with the inverter circuit 19a. The PMOS transistor PH11 and the NMOS transistor NH11 are connected in series, to form a CMOS inverter circuit 19b of the second stage. The NMOS transistor NH14 is connected in parallel with the inverter circuit 19b. Further, the PMOS transistor PH12 and the NMOS transistor NH12 are connected in series to form a CMOS inverter circuit 19c of the third stage. The NMOS transistor NH15 is connected in parallel with the inverter circuit 19c. Each of the inverter circuits 19a to 19c of respective stages is provided with a power supply voltage Vpp (5 V). The gate of each of the NMOS transistors NH13 to NH15 is provided with a sampling control signal SPL. Based on the control signal SPL, each of the NMOS transistors NH13 to NH15 is turned on and off.

The input terminal of the inverter circuit 19a (the gates of the MOS transistors PH10 and NH10) is connected to each of the sampling capacitors CS1 to CS5. The output terminal of the inverter circuit 19a (the drains of the MOS transistors PH10 and NH10) is connected to the input terminal of the inverter circuit 19b (the gates of the MOS transistors PH11 and NH11) via the coupling capacitor CC1. The output terminal of the inverter circuit 19b (the drains of the MOS transistors PH11 and NH11) is connected to the input terminal of the inverter circuit 19c (the gates of the MOS transistors PH12 and NH12) via the coupling capacitor CC2. A signal output from the inverter circuit 19c is provided to the level conversion circuit 17.

Figure 9:
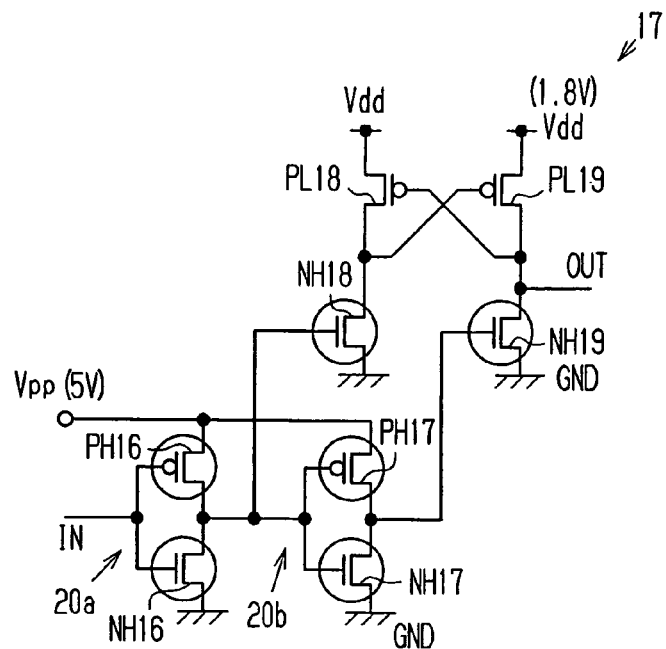
FIG. 9 is a schematic circuit diagram showing a level conversion circuit included in the AD conversion circuit of FIG. 8.

The level conversion circuit 17 is a voltage decreasing level conversion circuit for converting a signal amplitude from 5 to 1.8 V. The level conversion circuit 17 provides the sequential comparison control circuit 18 with a signal resulting from the conversion. FIG. 9 shows a specific circuit example of the level conversion circuit 17. The level conversion circuit 17 includes high voltage capacity PMOS transistors PH16 and PH17, high voltage capacity NMOS transistors NH16 to NH19, and low voltage capacity PMOS transistors PL18 and PL19. Between a 1.8 V power supply and the ground, the PMOS transistor PL18 and the NMOS transistor NH18 are connected in series, and the PMOS transistor PL19 and the NMOS transistor NH19 are connected in series. The gate of the PMOS transistor PL18 is connected to the drain of the PMOS transistor PL19. The gate of the PMOS transistor PL19 is connected to the drain of the PMOS transistor PL18.

The PMOS transistor PH16 and the NMOS transistor NH16 form an inverter circuit 20a. The PMOS transistor PH17 and the NMOS transistor NH17 form an inverter circuit 20b. The inverter circuit 20a receives an input signal IN and inverts the input signal IN to generate an inverted input signal IN. The inverted input signal IN is provided to the gate of the NMOS transistor NH18. The inverter circuit 20b receives the input signal IN inverted by the inverter circuit 20a and further inverts the inverted input signal IN to generate a twice-inverted input signal IN. The output signal of the inverter circuit 20b is provided to the gate of the NMOS transistor NH19. The input signal IN has a signal amplitude of 5 V. Each of the inverter circuits 20a and 20b is provided with a power supply voltage Vpp of 5 V.

When the input signal IN is at a H level (5 V), the output node of the inverter circuit 20a is set at a L level (0 V), and the output node of the inverter circuit 20b is set at a H level (5 V). Thus, the level conversion circuit 17 provides the sequential comparison control circuit 18 with a L level (0 V) output signal OUT. When the input signal IN is at a L level (0 V), the output node of the inverter circuit 20a is set at a H level (5 V), and the output node of the inverter circuit 20b is set at a L level (0 V). Thus, the level conversion circuit 17 provides the sequential comparison control circuit 18 with a H level (1.8 V) output signal OUT.

The sequential comparison control circuit 18 executes comparison control based on the output signal of the level conversion circuit 17 and provides the level conversion circuit 10 with a control signal for controlling the comparator 16 and the switch circuits SW1 and SW2. The level conversion circuit 10 converts a 1.8 V input signal IN into a 5 V signal, and controls the switch circuits SW1 and SW2 based on the 5 V output signal resulting from the conversion.

The following describes the operation of the AD conversion circuit 15 with the above-described structure.

Before the conversion is started, the NMOS transistors NH13 to NH15 are off based on a L level control signal SPL. When the conversion is started, the sequential comparison control circuit 18 shifts the control signal SPL to a H level to turn on the NMOS transistors NH13 to NH15, for sampling of an analog signal Vin. With the NMOS transistor NH13 being on, the potential of the output node DACOUT of each of the capacitors CS1 to CS5 becomes equal to the potential of the node N50. With the NMOS transistor NH14 being on, the potential of the node N51 becomes equal to the potential of the node N52. With the NMOS transistor NH15 being on, the potential of the node N53 becomes equal to the potential of the node N54. The PMOS transistor PH10 and the NMOS transistor NH10 form the first stage of the comparator 16. When the NMOS transistor NH13 is turned on, the potential of the output node DACOUT and the potential of the node N50 are set at a logical threshold VTL of the first stage of the comparator 16 (a threshold of the inverter circuit 19a). In the same manner, when the NMOS transistors NH14 and NH15 are turned on, the potential of each of the nodes N51, N52, N53, and N54 is also set at the logical threshold VTL.

The control signal SPL is set at a H level, and the sampling operation is started. Then, the capacitors CS1 to CS5 are all connected to the analog input terminal via the switch circuits SW1 and SW2 while the output node DACOUT is maintained at the potential VTL. This causes the capacitors CS1 to CS5 to be charged to the potential of the analog signal Vin.

After the sampling operation is completed, the comparison operation is started. Digital data is determined one bit after another from its most significant bit (MSB). To be specific, the NMOS transistor NH15 is turned off based on a L level control signal SPL. After that, for example, the switch circuits SW1 and SW2 are controlled so that the capacitors CS1 to CS4 are connected to the terminal of the ground GND, and the capacitor CS5 is connected to the terminal of the reference potential Vref. The potential of the output node DACOUT, which is determined by charge redistribution, is Vref/2−Vin+VTL. In this way, the first stage circuit 19a (the transistors PH10 and NH10), the second stage circuit 19b (the transistors PH11 and NH11), and the third stage circuit 19c (the transistors PH12 and NH12) of the comparator 16 determine whether the potential of the analog signal Vin is larger or smaller than ½ of the reference potential Vref. A signal indicating the determination result is output from the node N54. The MSB is determined based on the level of this output signal.

In the same manner, the switch circuits SW1 and SW2 are controlled so that a potential of Vref/4−Vin+VTL or a potential of 3Vref/4−Vin+VTL is generated. In this way, the digital data is determined one bit after another following the MSB. For example, the capacitors CS1, and CS3 to CS5 are connected to the terminal of the ground GND, and the capacitor CS2 is connected to the terminal of the reference potential Vref. In this case, the potential of the node DACOUT provided to the comparator 16 is set as Vref/16−Vin+VTL. In this way, the potential of the output node DACOUT is changed by connecting each of the capacitors CS1 to CS5 to the terminal of the reference potential Vref or to the terminal of the ground GND with the use of the switches SW1 and SW2. The potential of the output node DACOUT is changed specifically by Vref/16 in units of Cx, which is 1/16 of a total capacitor value 16 Cx of the sampling capacitors CS1 to CS5. In this way, the 4-bit digital data is determined.

Figure 10:
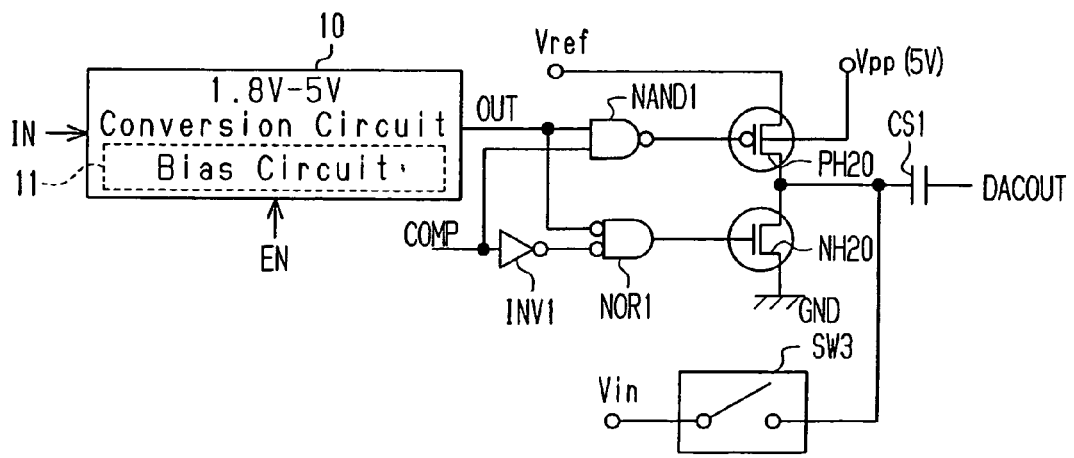
FIG. 10 is a schematic circuit diagram showing a switch circuit included in the AD conversion circuit of FIG. 8.

FIG. 10 shows a specific circuit example of the switch circuit controlled based on an output signal of the level conversion circuit 10.

As shown in FIG. 10, an output signal OUT of the level conversion circuit 10 is provided to a first input terminal of a NAND circuit NAND1, and to a first input terminal of a NOR circuit NOR1. A control signal COMP for starting comparison is provided to a second input terminal of the NAND circuit NAND1. The control signal COMP is inverted by an inverter circuit INV1 and is provided to a second input terminal of the NOR circuit NOR1. The NAND circuit NAND1, the NOR circuit NOR1, and the inverter circuit INV1 are gate circuits, which are provided with and operated at a power supply voltage of 5 V.

An output signal of the NAND circuit NAND 1 is provided to the gate of a high voltage capacity PMOS transistor PH20. An output signal of the NOR circuit NOR1 is provided to the gate of a high voltage capacity NMOS transistor NH20. The drains of the MOS transistors PH20 and NH20 are connected to each other. The connecting node of the MOS transistors PH20 and NH20 is connected to a sampling capacitor CS1. The source of the PMOS transistor PH20 is provided with a reference potential Vref. The source of the NMOS transistor NH20 is connected to the ground GND. A switch circuit SW3 is connected to the connecting node of the MOS transistors PH20 and NH20 and the capacitor CS1. An analog signal (input voltage) Vin is provided to the capacitor CS1 via the switch circuit SW3.

The following describes the operation timings of the AD conversion circuit 15.

Figure 11:
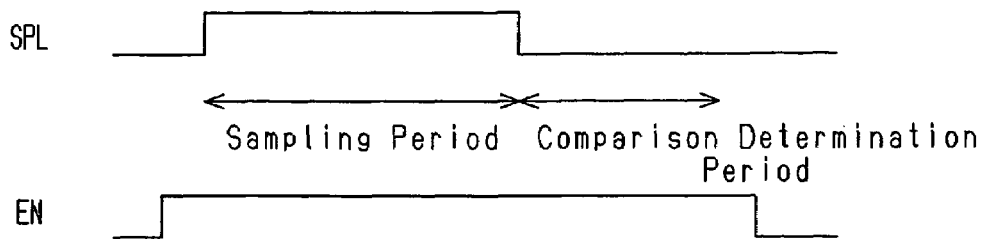
FIG. 11 is a diagram describing control timings of the AD conversion circuit of FIG. 8.

As shown in FIG. 11, the control signal EN, which is provided to the level conversion circuit 10, shifts from a L level to a H level at the same time with or before the start of the sampling. Based on the H level control signal EN, current flows through the bias circuit 11 of the level conversion circuit 10 so that the bias circuit 11 is activated. Several tens of nanoseconds after the control signal EN shifts to a H level, the bias potential NB reaches a stationary state. Thus, when the sampling period is several hundreds of nanoseconds to several thousands of nanoseconds, the bias circuit 11 is activated into an operating state at sufficiently high speed. A current then flows through the bias circuit 11. The input signal IN of the level conversion circuit 10 changes and the output signal OUT also changes according to the input signal IN in a state where an output impedance of the bias circuit 11 is low.

In a sampling period of the AD conversion circuit 15 (a period where the sampling control signal SPL is at a H level), the control signal COMP is set at a L level. Thus, the PMOS transistors PH20 and the NMOS transistor NH20 are turned off. In this state, the switch circuit SW3 is closed, so that the sampling capacitor CS1 is charged to the potential of the analog signal Vin.

Also, the control signal COMP is set at a H level in a comparison determination period. Based on the output signal OUT of the level conversion circuit 10, one of the MOS transistors PH20 and NH20 is turned on, so that the sampling capacitor CS1 is connected to the terminal of the potential Vref or the ground.

After the comparison determination is completed, the control signal EN is set at a L level, and a current flowing through the bias circuit 11 of the level conversion circuit 10 is stopped.

As described above, the level conversion circuit 10 of the first embodiment is applicable to the sequential comparison AD conversion circuit 15. Also, the level conversion circuit 10 may be applied to a resource of an MCU like the sequential comparison AD conversion circuit 15 in the second embodiment. In this case, the MCU obtains in advance the timing at which each resource operates. The MCU activates the bias circuit 11 before each resource starts its operation, and deactivates the bias circuit 11 after each resource ends its operation. In this way, a bias current in the bias circuit 11 is reduced.

Third Embodiment

The following describes a level conversion circuit 22 according to a third embodiment of the present invention.

Figure 12:
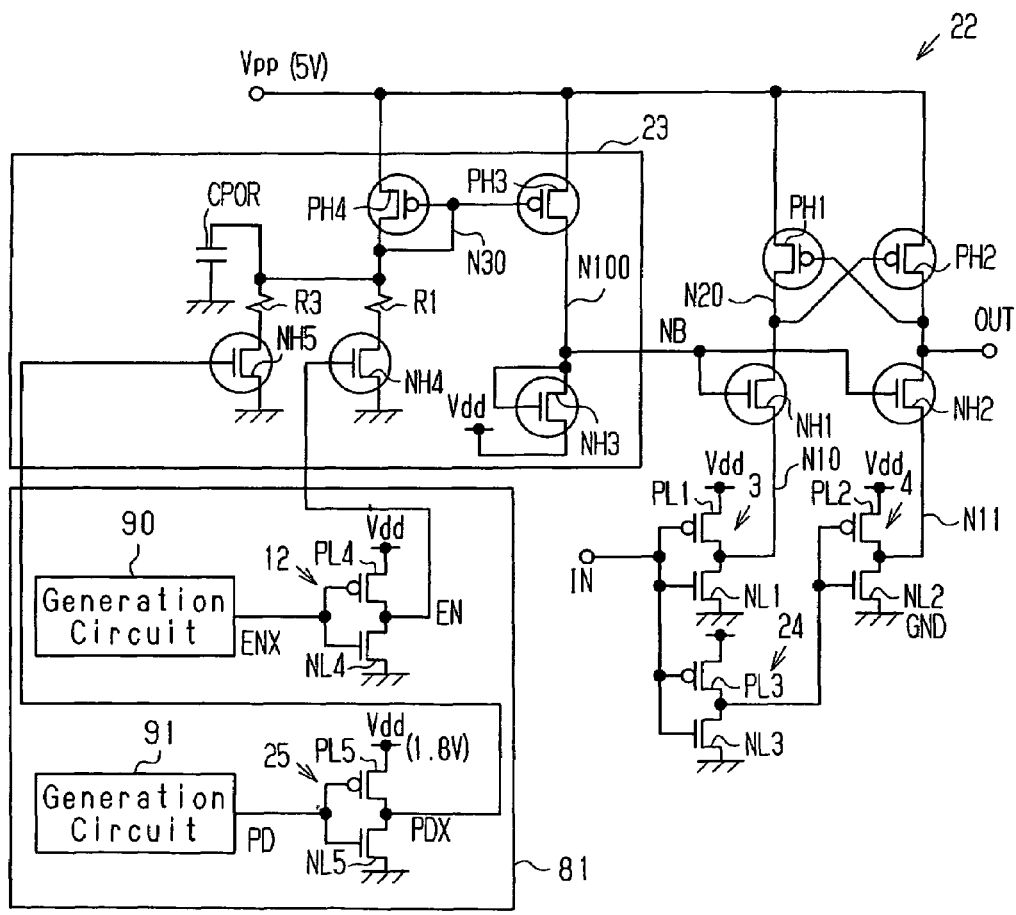
FIG. 12 is a schematic circuit diagram showing a level conversion circuit according to a third embodiment of the present invention.

FIG. 12 shows the level conversion circuit 22 according to the third embodiment. The level conversion circuit 22 differs from the level conversion circuit 10 of the first embodiment in that its bias circuit 23 has a circuit structure differing from the corresponding component, and the level conversion circuit 22 additionally includes an inverter circuit 24 formed by a low voltage capacity PMOS transistor PL3 and a low voltage capacity NMOS transistor NL3. In FIG. 12, components that are the same as the corresponding components in the first embodiment (refer to FIG. 7) are given the same reference numerals as those components. The following describes the third embodiment focusing on its differences from the first embodiment.

The potential at the output node N10 of the inverter circuit 3 shifts from a H level to a L level when a current flowing through the NMOS transistors NH1 and NL1 is larger than a current flowing through the PMOS transistor PH1. Thus, the fall of the output node N10 may be slow, depending on the circuit design. Also, in the level conversion circuit 10, the potential of the output node N10 of the inverter circuit 3 is inverted by the inverter circuit 4. Thus, the rise of the output node 11 of the inverter circuit 4 may be slow, depending of the circuit design. Compared with this, the level conversion circuit 22 of the third embodiment includes, in addition to the inverter circuit 3, another inverter circuit 24 connected to the input node of the inverter circuit 4. The inverter circuit 24 inverts the input signal IN, to generate an inverted input signal IN. An output signal of the inverter circuit 24 is provided to the inverter circuit 4.

The bias circuit 23 is connected to a control circuit 81. The control circuit 81 includes an inverter circuit 12, a generation circuit 90, a generation circuit 91 for generating a control signal PD, and an inverter circuit 25 connected to the generation circuit 91. The control circuit 81 generates a control signal PDX, in addition to a control signal EN.

The following describes the structure of the bias circuit 23 of the third embodiment.

The bias circuit 23 includes high voltage capacity PMOS transistors PH3 and PH4, high voltage capacity NMOS transistors NH3, NH4, and NH5, resistors R1 and R3, and a capacitor CPOR. In the bias circuit 23, the connection among the high voltage capacity PMOS transistors PH3 and PH4, the high voltage capacity NMOS transistors NH3 and NH4, the resistor R1, and the capacitor CPOR is the same as the connection of the bias circuit 11 in the first embodiment, and is not described here.

In the bias circuit 23 of the third embodiment, the drain of the PMOS transistor PH4 (the connecting node N30 of the gates of the PMOS transistors PH3 and PH4) is connected to the ground via the resistor R3 and the NMOS transistor NH5, unlike in the first embodiment. The gate of the NMOS transistor NH5 is provided with the control signal PD obtained by inverting the control signal PD via the inverter circuit 25 (a CMOS inverter circuit formed by the PMOS transistor PL5 and the NMOS transistor NL5). Normally, the control signal PD is set at a L level and the control signal PDX is set at a H level.

In the bias circuit 11, the NMOS transistor NH4 is turned off when the control signal EN provided is at a L level. No current flows in an inversion area of the PMOS transistor PH3. A leakage current flowing through each of the MOS transistors PH3 and NH3 determines the bias potential NB.

As one example, the level conversion circuit 10 of the first embodiment may be manufactured with the Nwell process using a p-type substrate. In this case, a drain junction of the PMOS transistor PH3 includes a p-n junction in the reverse direction with respect to the power supply voltage Vpp and the bias potential NB. A drain junction of the NMOS transistor NH3 includes a p-n junction in the reverse direction with respect to the bias potential NB and the ground GND. The level conversion circuit 10 is to be designed taking into consideration leakage current flowing in these reverse p-n junctions. For example, an area of the drain junction of the PMOS transistor PH3 may be increased so that a leakage current of the PMOS transistor PH3 increases. Such designing enables the bias potential NB to be set at its target value (at or a little lower than a potential higher than the power supply voltage Vdd by the threshold voltage Vth of the high voltage capacity NMOS transistor). Compared with this, the bias circuit 23 shown in FIG. 12 enables the bias potential NB to be set at its target value more easily and precisely.

As one example, in the bias circuit 23, a resistance of the resistor R1 may be about 400 kΩ and a resistance of the resistor R3 may be about 4000 kΩ. The power supply voltage Vpp may be 5 V, and the threshold voltage Vth of the PMOS transistor PH4 may be 1 V. In this case, when the control signal EN is at a H level, a current of 4 (V)/400(kΩ)=10(uA) flows through the resistor R1. When the PMOS transistors PH3 and PH4 that together form a current mirror circuit have the same gate width W, a current of 10 uA also flows through the PMOS transistor PH3 (when the control signal PD is at a L level, precisely a current of 11 uA flows through the PMOS transistor PH3 because a current also flows through the resistor R3). When the bias circuit 23 is designed so that the gate width W of the NMOS transistor NH3 is ten times the gate width W of the NMOS transistors NH1 and NH2, leakage current of 1 uA flows through the NMOS transistors NH1 and NH2.

When the control signal EN is at a L level and the control signal PD is at a L level, no current flows through the resistor R1, and a current flows only through the resistor R3. In this case, a current of 1 uA flows through the PMOS transistor PH3, and a leakage current of 0.1 uA flows through the NMOS transistors NH1 and NH2.

In this way, the bias circuit 23 includes the resistor R1, for allowing a large amount of current (a current of 10 uA described above) to flow when the level conversion circuit 22 operates, and the resistor R3, for allowing a small amount of current (a current of 1 uA described above) to flow when the output of the level conversion circuit 22 is unchanged. This structure enables a current flowing through the bias circuit 23 to be precisely set even in a standby state when the output of the level conversion circuit 22 is unchanged. Although the value of the current flowing through the resistor R3 is assumed to be 1 uA, the current value of the resistor R3 may be appropriately changed in such a range that does not cause the current to be problematic during a standby state.

In the level conversion circuit 22, a current flowing through the resistor R3 is also stopped by setting the control signal PD at a H level (or by setting the control signal PDX at a L level). When a bias current of 1 uA during standby is problematic, e.g., at the time of the IDDQ measurement, the control signal PD is set at a H level.

Although the bias circuit 23 in the third embodiment does not include the capacitor C1 for stabilizing the bias potential NB, the bias circuit 23 may include the capacitor C1 as necessary. The third embodiment describes the case in which the 1.8 V control signals PD and PDX are applied. However, when a current flowing through the bias circuit 23 is stopped only at the time of testing, 5 V control signals PD and PDX may be applied instead.

Figure 13:
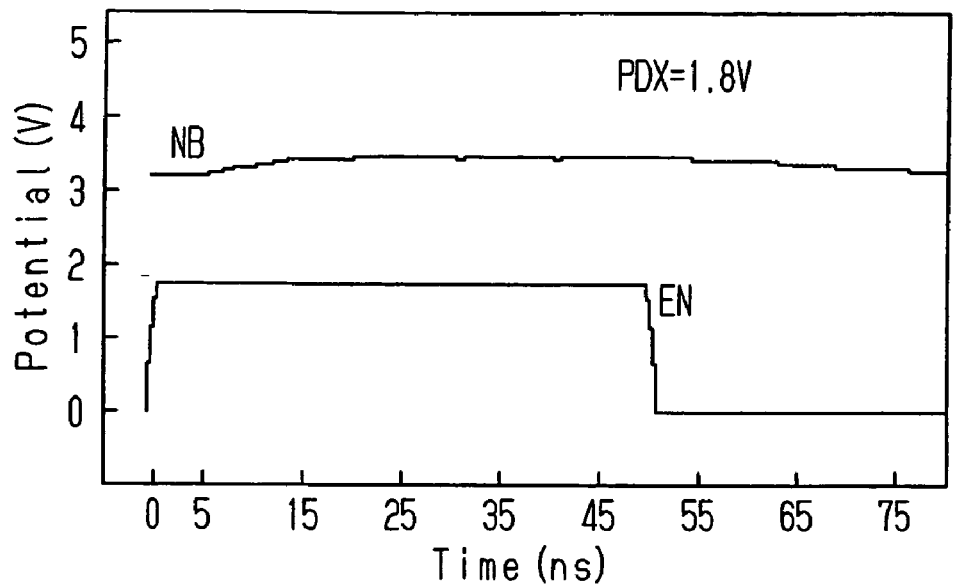
FIG. 13 is an operation waveform diagram of the level conversion circuit of FIG. 12.
Figure 13:
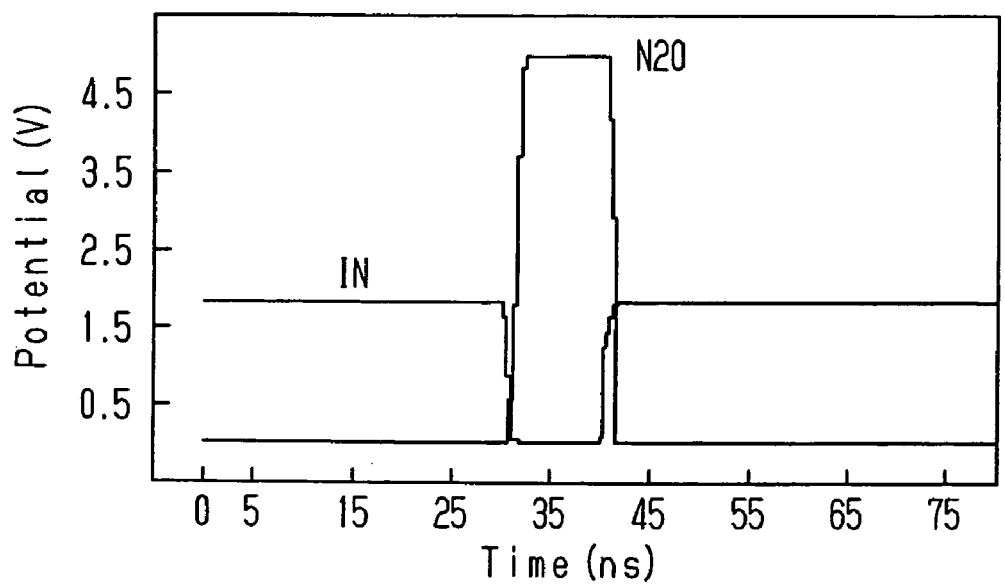

FIG. 13 is a waveform diagram showing the operation of the level conversion circuit 22 of FIG. 12.

FIG. 13 shows the operation when the threshold voltage Vth of the high voltage capacity NMOS transistor is about 1 V, the power supply voltage Vdd is 1.8 V, and the power supply voltage Vpp is 5 V. The phase of the input signal IN of the level conversion circuit 22 is the same as the phase of its output signal OUT (signal waveforms of the input and output signals overlap and difficult to differentiate). For differentiation, FIG. 13 shows the signal waveform of the node N20, which has the phase opposite to the phase of the input signal IN, instead of the output signal OUT.

At time 0, the control signal EN shifts from a L level to a H level. Bias current flows through the bias circuit 23, and the bias potential NB increases. At time 30 ns, the input signal shifts from a H level to a L level. At time 40 ns, the input signal IN shifts from a L level to a H level. The output signal OUT (the potential of the node N20 in FIG. 13) changes according to the input signal IN. At time 50 ns, the control signal EN shifts from a H level to a L level, so that the bias potential NB returns to a standby state. The control signal PDX is maintained at a signal level of 1.8 V (H level)

As shown in FIG. 13, setting the control signal EN at a H level causes the bias potential NB to increase to a value required during operation. Setting the control signal EN at a L level causes the bias potential NB to decrease gradually. Although the threshold voltage Vth of the high voltage capacity NMOS transistor is about 1 V, the bias potential NB is about 3.5 V because of the substrate bias effect.

The level conversion circuit 22 of the third embodiment has the advantages described below.

(1) The bias circuit 23 includes the two resistors R1 and R3 for determining the bias current. By setting the resistance of each of the resistors R1 and R3 according to a current value required during operation or according to a current value required during standby, the bias current is easily set at a value required during operation or at a value required during standby. A large amount of current is allowed to flow through the bias circuit 23 only when necessary. Thus, an equivalent impedance of the bias circuit 23 for generating the bias potential NB is lowered only when necessary. The control of the bias current has no adverse influences on the level conversion function of the level conversion circuit 22.

(2) In the level conversion circuit 22, the output node of the inverter circuit 24, which is arranged separately from the inverter circuit 3, is connected to the input node of the inverter circuit 4. The inverter circuit 4 inverts an output signal of the inverter circuit 24, to generate a potential of the node 11. In this way, the level conversion circuit 22 realizes high-speed operation.

Fourth Embodiment

The following describes a level conversion circuit 27 according to a fourth embodiment of the present invention.

Figure 14:
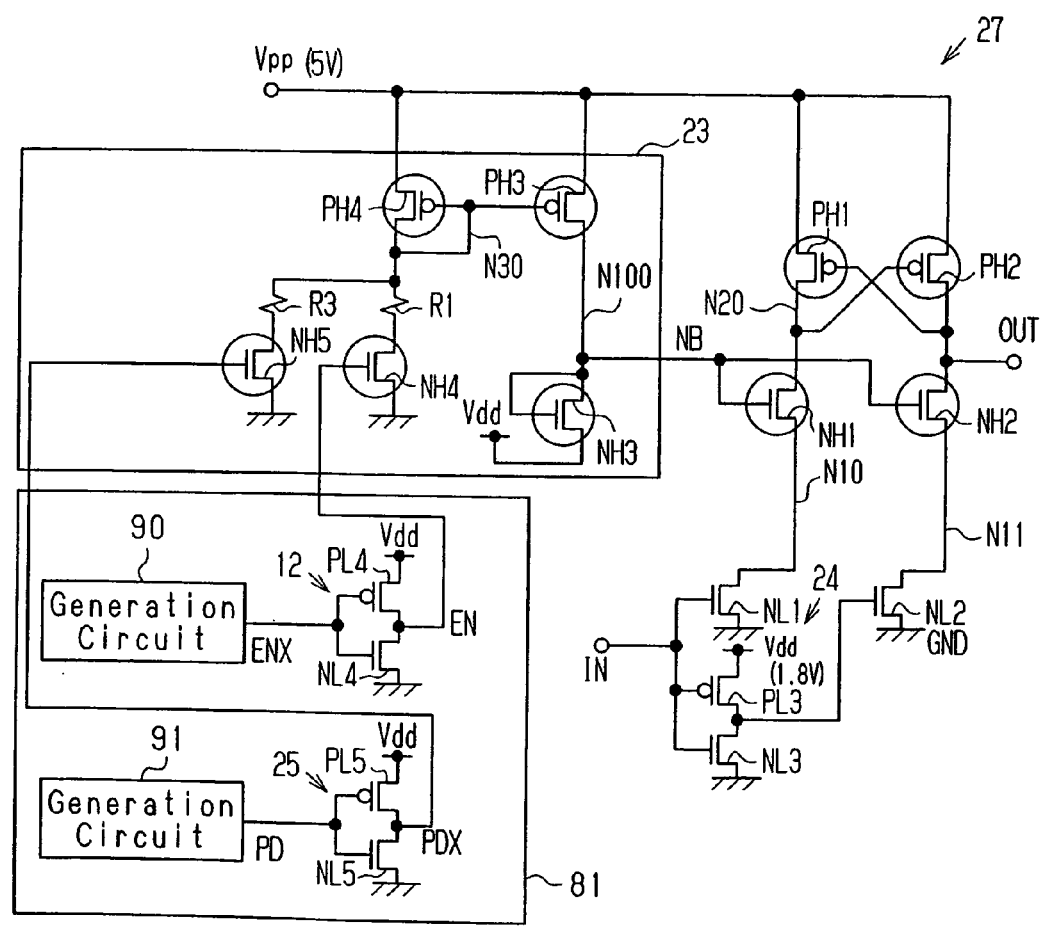
FIG. 14 is a schematic circuit diagram showing a level conversion circuit according to a fourth embodiment of the present invention.

FIG. 14 shows the level conversion circuit 27 according to the fourth embodiment. The level conversion circuit 27 differs from the level conversion circuit 22 of the third embodiment in that the level conversion circuit 27 does not include the PMOS transistors PL1 and PL2 of the inverter circuits 3 and 4 that receive an input signal IN. In FIG. 14, components that are the same as the corresponding components in the third embodiment are given the same reference numerals as those components. The following describes the fourth embodiment focusing on its differences from the third embodiment.

In the level conversion circuit 22 of FIG. 12, when the nodes N10 and N11 are at a H level, the nodes N10 and N11 are set at the power supply voltage Vdd by turning on the PMOS transistors PL1 and PL2. Thus, the level conversion circuit 22 determines the H level of the nodes N10 and N11 directly at the power supply voltage Vdd using the PMOS transistors PL1 and PL2. When the input signal IN changes, the node N10 or N11 is charged to the power supply voltage Vdd by the PMOS transistors PL1 or PL2. Thus, the level conversion circuit 22 has such an advantage that the NMOS transistor NH1 or NH2 is turned off at an earlier timing.

Compared with this, the level conversion circuit 27 of the fourth embodiment does not include the PMOS transistors PL1 and PL2. Even without the PMOS transistors PL1 and PL2, the bias potential NB generated in the bias circuit 23 is set at Vdd+Vth. The drain potential of the NMOS transistors NH1 and NH2 is set substantially at the power supply voltage Vdd. Although the bias circuit 23 in FIG. 14 does not include the capacitor CPOR, the bias circuit 23 may include the capacitor CPOR as necessary.

The level conversion circuit 27 of the fourth embodiment operates in the same manner as the level conversion circuit 22 of the third embodiment. Also, the level conversion circuit 27 has such an advantage that an unintended current does not flow even when the bias potential NB is at a transient potential, or at an unintended potential (intermediate potential), and the power supply voltage Vpp is 0 V. The circuit structure of the level conversion circuit 27 is required when the bias potential NB is generated from a power supply voltage differing from the power supply voltages Vdd and Vpp. As one example, an LSI may include circuits operable at power supply voltages of 1.8, 5, and 3.3 V. In this LSI, the bias potential NB may be generated from the power supply voltage of 3.3 V, and signal levels may be converted from 1.8 to 5 V. In this case, there may exist a state where the 5 V power supply voltage Vpp is 0 V (the power supply with the power supply voltage Vpp is not activated), the power supply voltage Vdd is 1.8 V, and the bias potential NB is Vdd+Vth. In the case of the level conversion circuit 22 including the PMOS transistors PL1 and PL2, the potential of the node N10 is set at 1.8 V when the input signal IN is at a L level as shown in FIG. 12. When the power supply voltage Vpp is set at 0 V, the potential of the back gate of the PMOS transistor PH1 is also set at 0 V. With the bias potential NB of Vdd+Vth being provided to the gate of the NMOS transistor NH1, the NMOS transistor NH1 is turned on. Current undesirably flows through the back gate of the PMOS transistor PH1 via a path including the PMOS transistor PL1 and the NMOS transistor NH1.

The level conversion circuit 27 of the fourth embodiment does not include the PMOS transistors PL1 and PL2. This means that the level conversion circuit 27 does not have the above-described current flowing path from the power supply voltage Vdd. Even when the power supply voltage Vpp is 0 V and the bias potential NB is Vdd+Vth, the level conversion circuit 27 prevents an unintended current (undesirable current) from flowing through the back gate of the PMOS transistor PH1.

In this way, the level conversion circuit 27 of the fourth embodiment easily separates the power supply voltage Vpp and the power supply voltage Vdd regardless of the bias potential NB. To be specific, when the bias potential NB is generated from a power supply voltage other than the power supply voltage Vpp, the circuit not including the PMOS transistors PL1 and PL2, like the level conversion circuit 27, enables reliable separation of a plurality of power supplies.

Fifth Embodiment

The following describes a level conversion circuit 28 according to a fifth embodiment of the present invention.

Figure 15:
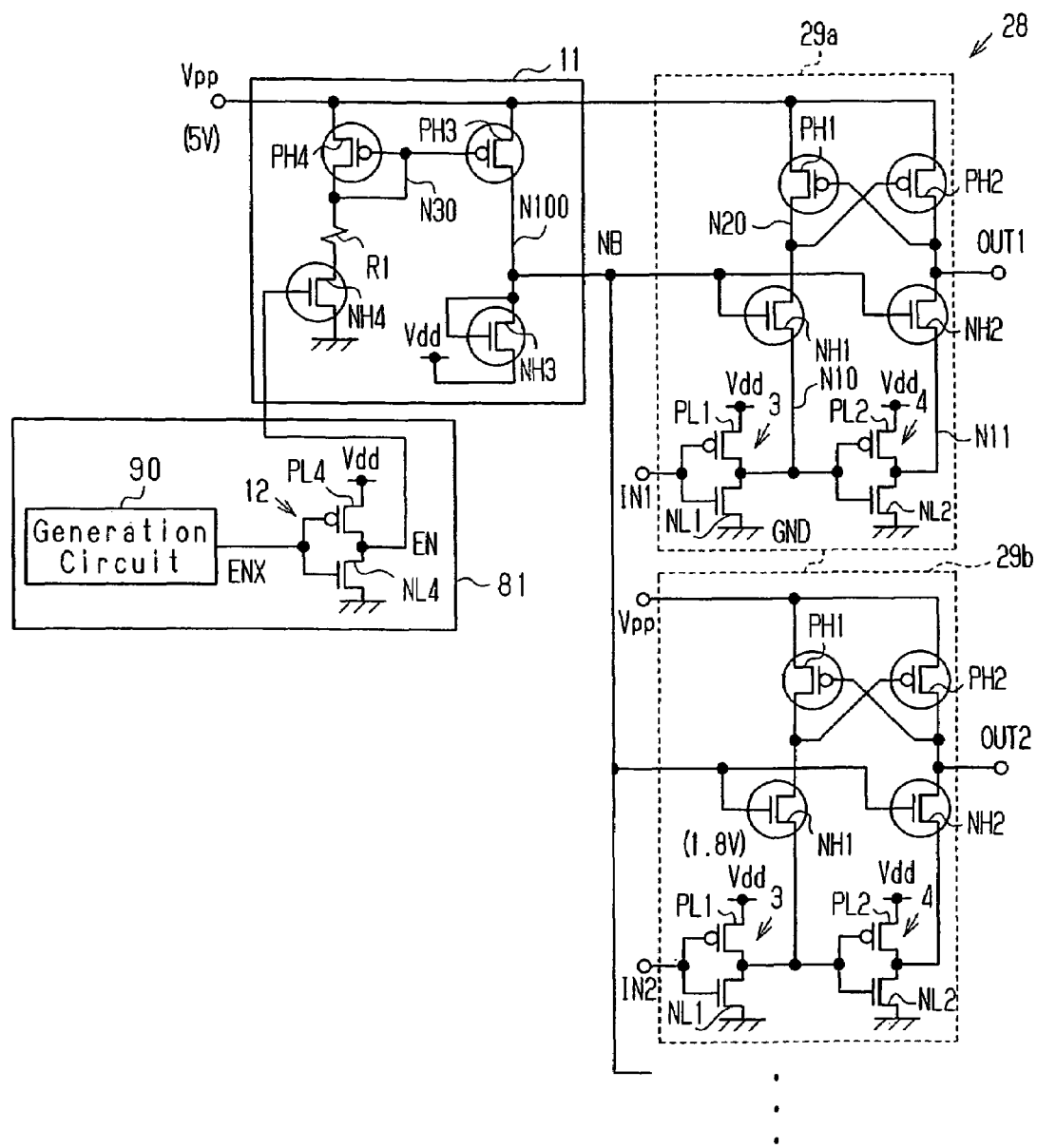
FIG. 15 is a schematic circuit diagram showing a level conversion circuit according to a fifth embodiment of the present invention.

FIG. 15 shows the level conversion circuit 28 according to the fifth embodiment. The level conversion circuit 28 differs from the level conversion circuit 10 of the first embodiment in that the level conversion circuit 28 includes a plurality of conversion units 29a, 29b, etc., formed by MOS transistors PH1, PH2, PL1, PL2, NH1, NH2, NL1, and NL2. In FIG. 15, components that are the same as the corresponding components in the first embodiment are given the same reference numerals as those components.

In the level conversion circuit 28, the connection among the MOS transistors PH1, PH2, PL1, PL2, NH1, NH2, NL1 and NL2 that form the conversion units 29a, 29b, etc., is the same as the connection in the first embodiment. In the level conversion circuit 28, the conversion circuits 29a, 29b, etc., of respective stages receive 1.8 V input signals IN1, IN2, etc., respectively, and outputs 5 V output signals OUT1, OUT2, etc., corresponding to the input signals IN1, IN2, etc., respectively. The bias potential NB generated in the bias circuit 11 is provided to each of the NMOS transistors NH1 and NH2 in the conversion units 29a, 29b, etc., of respective stages. Although the bias circuit 11 in FIG. 15 does not include the capacitors CPOR and C1, the bias circuit 11 may include the capacitors CPOR and C1 as necessary.

In the level conversion circuit 28 of the fifth embodiment, the plurality of conversion units 29a, 29b, etc., share the bias circuit 11. The level conversion circuit 28 is to be designed so that the conversion units 29a, 29b, etc., operate at the same timing. Such designing enables the bias current of the bias circuit 11 to be reduced during a period where the output of the level conversion circuit 28 is unchanged.

Sixth Embodiment

The following describes a level conversion circuit 30 according to a sixth embodiment of the present invention.

Figure 16:
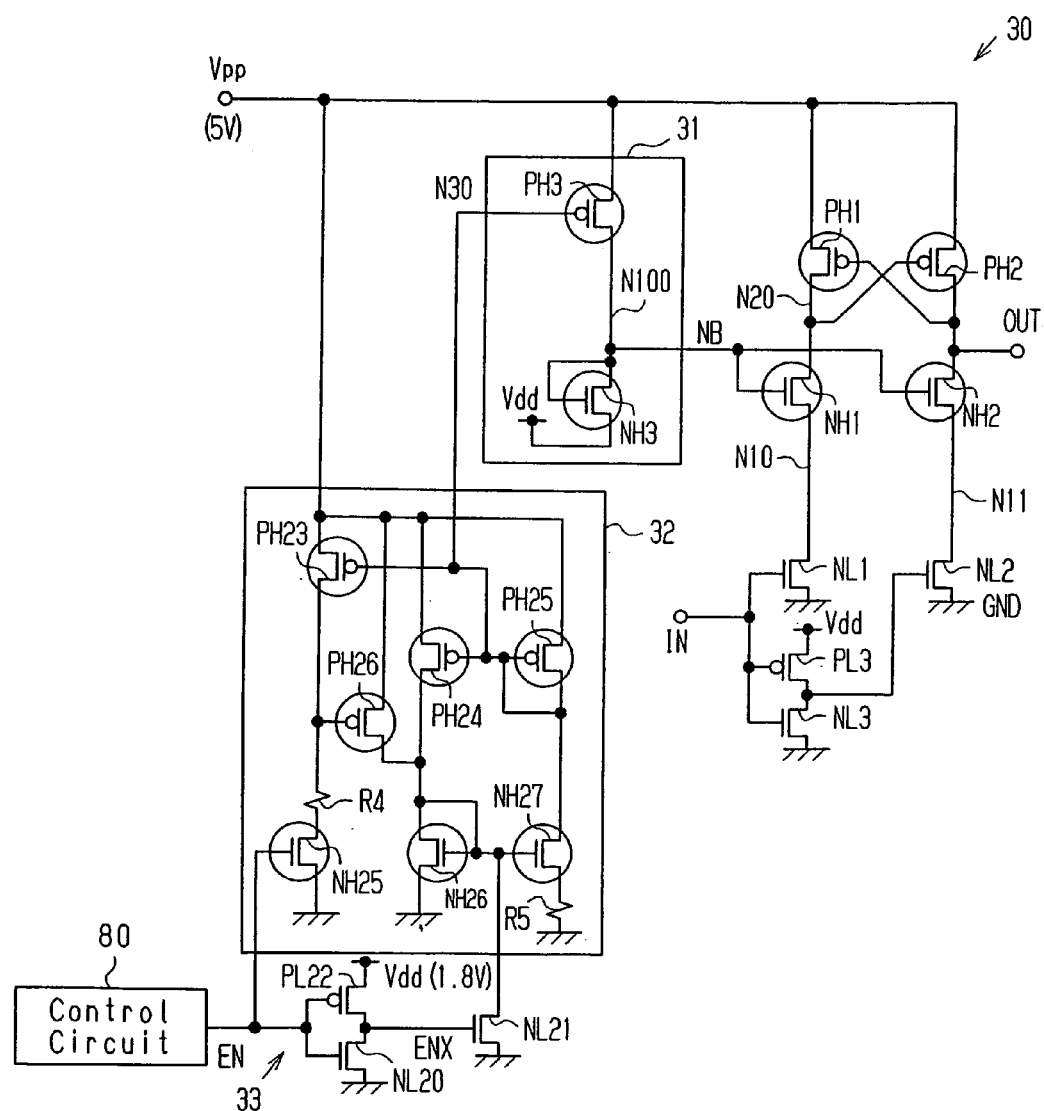
FIG. 16 is a schematic circuit diagram showing a level conversion circuit according to a sixth embodiment of the present invention.

FIG. 16 shows the level conversion circuit 30 according to the sixth embodiment. The level conversion circuit 30 differs from the level conversion circuit 27 of the fourth embodiment in that its bias circuits 31 and 32 have a circuit structure differening from the corresponding component.

In the bias circuit 23 of the fourth embodiment, the resistor R1 determines the bias current flowing through the NMOS transistor NH3. In the sixth embodiment, a complex circuit determines the bias current.

To be specific, the bias circuit 31 includes a high voltage capacity PMOS transistor PH3 and a high voltage capacity NMOS transistor NH3. The PMOS transistor PH3 and the NMOS transistor NH3 are connected in series. The source of the PMOS transistor PH3 is provided with a power supply voltage Vpp of 5 V. The NMOS transistor NH3 is diode-connected. The source of the NMOS transistor NH3 is provided with a power supply voltage Vdd of 1.8 V. The gate of the PMOS transistor PH3 is connected to the bias circuit 32. A bias potential NB is generated at the connecting node of the drains of the MOS transistors PH3 and NH3. The node potential NB is provided to the gate of each of the NMOS transistors NH1 and NH2.

The bias circuit 32 includes high voltage capacity PMOS transistors PH23, PH24, PH25, and PH26, and high voltage capacity NMOS transistors NH25, NH26, and NH27, and resistors R4 and R5. The sources of the PMOS transistors PH23 to PH26 are connected to one another. The source of each of the PMOS transistors PH23 to PH26 is provided with the power supply voltage Vpp. The drain of the PMOS transistor PH23 is connected to the gate of the PMOS transistor PH26, and is connected to the drain of the NMOS transistor NH25 via the resistor R4. The source of the NMOS transistor NH25 is connected to the ground. A control circuit 80 is connected to the gate of the NMOS transistor NH25. The gate of the NMOS transistor NH25 is provided with a 1.8 V control signal EN.

The gates of the PMOS transistors PH23, PH24, and PH25 are connected to one another, and also are connected to the gate of the PMOS transistor PH3 of the bias circuit 31. The gate of each of the PMOS transistors PH23, PH24, and PH25 is connected to the drain of the PMOS transistor PH25 and to the drain of the NMOS transistor NH27. The drains of the PMOS transistors PH24 and PH26 and the NMOS transistor NH26 are connected to one another, and are also connected to the gates of the NMOS transistor NH26 and NH27. The source of the NMOS transistor NH26 is connected to the ground. The source of the NMOS transistor NH27 is connected to the ground via the resistor R5.

The low voltage capacity PMOS transistor PL22 and the low voltage capacity NMOS transistor NL20 form an inverter circuit 33. The inverter circuit 33 inverts a control signal EN, to generate a control signal ENX. The control signal ENX is provided to the gate of the low voltage capacity NMOS transistor NL21. The drain of the NMOS transistor NL21 is connected to the gate of each of the NMOS transistors NH26 and NH27 of the bias circuit 32. The source of the NMOS transistor NL21 is connected to the ground.

In the bias circuit 32, a current mirror loop configured by the PMOS transistors PH24 and PH25, the NMOS transistors NH26 and NH27, and the resistor R5 forms a known self-bias circuit. The current mirror loop determines the bias current of the bias circuit 31. The bias circuit 32 has such an advantage that the resistance of the resistor R5 is reduced. For example, when the NMOS transistors NH26 and NH27 operate in a sub threshold area, the current flowing through the MOS transistors PH24, PH25, NH26, and NH27, and the resistor R5 is determined as a value obtained by dividing a voltage substantially equal to a thermal voltage (kT/q, where k is the Boltzmann constant, T the absolute temperature, and q the electronic charge) by the resistance of the resistor R5.

The gate of the PMOS transistor PH3 of the bias circuit 31 is provided with the bias potential of the self-bias circuit (the potential of the node N30), so that the current determined by the self-bias circuit flows through the PMOS transistor PH3.

In the bias circuit 32, the PMOS transistors PH23 and PH26, the NMOS transistor NH25, and the resistor R4 function as a startup circuit. When the control signal EN is at a H level, the NMOS transistor NH25 is turned on. Without a current flowing through the PMOS transistors PH24 and PH25, the gate potential of the PMOS transistor PH26 is set at 0 V.

When the gate potential of the PMOS transistor PH26 is set at 0 V, current starts flowing through the NMOS transistor NH26. Current then flows through the current mirror loop (the MOS transistors PH24, PH25, PH26, NH26, and NH27 and the resistor R5) to finally reach its stabilizing point. With a current flowing through the PMOS transistors PH24 and PH25, current also flows through the PMOS transistor PH23. The gate potential of the PMOS transistor PH26 is set at the power supply voltage Vpp. The operation of the startup circuit is then stopped.

When the bias circuit 32 is provided with a H level control signal EN, the startup circuit operates so that the bias circuit 32 starts up. Along with this, bias current flows through the NMOS transistor NH3 of the bias circuit 31. When the bias circuit 32 is provided with a L level control signal EN, no current flows through the startup circuit, so that the startup circuit does not function. The H level control signal ENX causes the NMOS transistor NL21 to be on. Thus, the NMOS transistors NH26 and NH27 are turned off so that no current flows through the bias circuit 32.

In this way, the level conversion circuit 30 controls, with the use of the complex bias circuit 32, on and off of current flowing through the bias circuit 32 based on the 1.8 V control signal EN as in the fourth embodiment.

Seventh Embodiment

The following describes a level conversion circuit 35 according to a seventh embodiment of the present invention.

Figure 17:
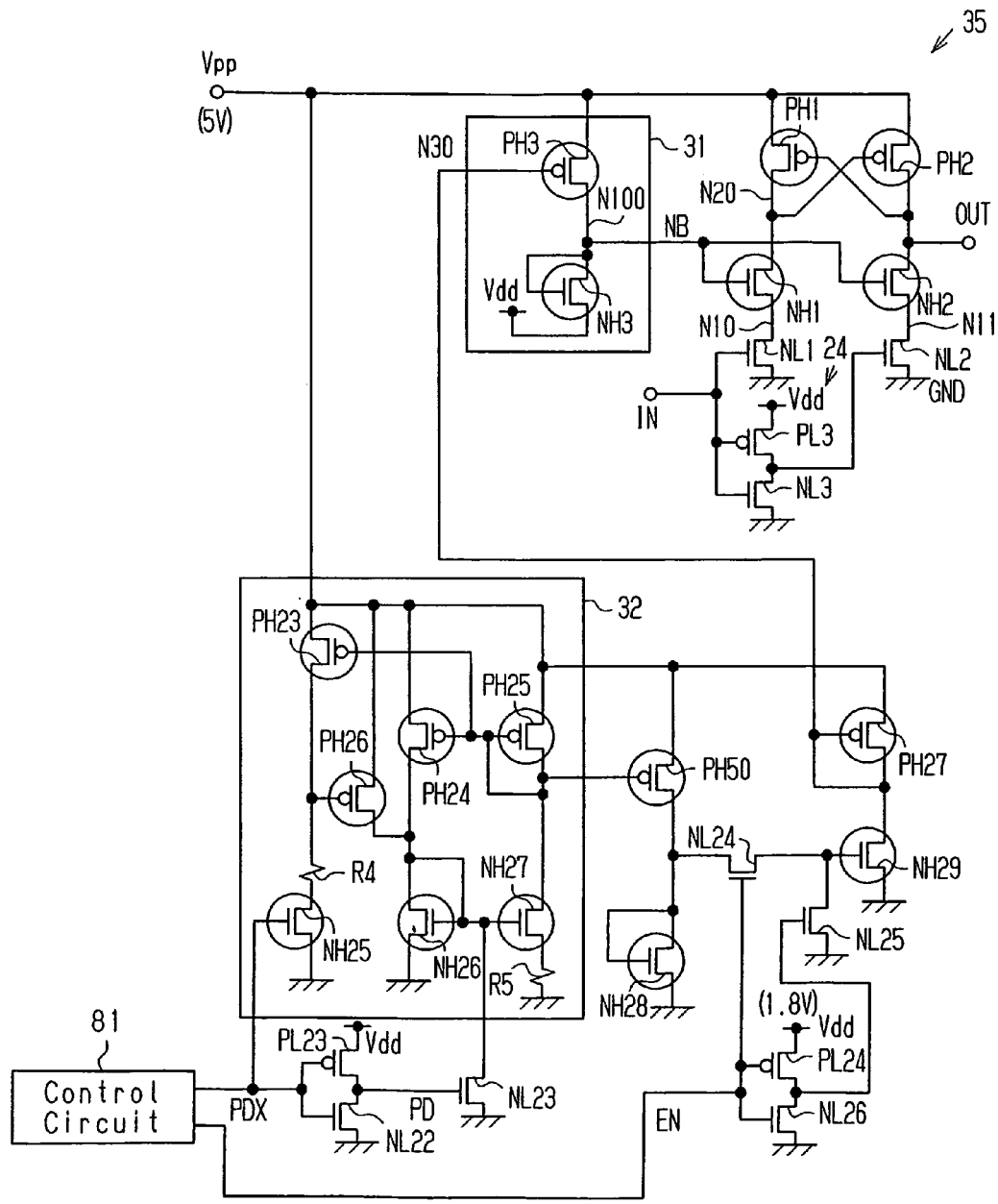
FIG. 17 is a schematic circuit diagram showing a level conversion circuit according to a seventh embodiment of the present invention.

FIG. 17 shows the level conversion circuit 35 according to the seventh embodiment.

In the sixth embodiment, current flowing through the bias circuit 32 is directly controlled on and off based on a control signal EN. In the level conversion circuit 35 of the seventh embodiment, current flowing through its bias circuit 32 is controlled on and off based on a control signal PD different from a control signal EN, and a circuit unit that amplifies a current by a current mirror ratio is controlled on and off by the control signal EN. The bias current flowing through its bias circuit 31 is controlled by the potential generated in that circuit unit. In FIG. 17, components that are the same as the corresponding components in the sixth embodiment are given the same reference numerals as those components. The following describes the seventh embodiment focusing on its differences from the sixth embodiment.

The sources of the high voltage capacity PMOS transistors PH26 and PH27 are connected to the source of the PMOS transistor PH25 of the bias circuit 32. The gate of the PMOS transistor PH26 is connected to the connecting node of the gate and the drain of the PMOS transistor PH25. The drain of the PMOS transistor PH50 is connected to the ground via the diode-connected NMOS transistor NH28.

The gate and the drain of the PMOS transistor PH27 are connected to each other. The connecting node of the gate and the drain of the PMOS transistor PH27 is connected to the drain of the NMOS transistor NH29, and to the gate of the PMOS transistor PH3 of the bias circuit 31. The source of the NMOS transistor NH29 is connected to the ground. The gate of the NMOS transistor NH29 is connected to the connecting node (drains) of the PMOS transistor PH26 and the NMOS transistor NH28 via the NMOS transistor NL24. The gate of the NMOS transistor NH29 is connected to the ground via the NMOS transistor NL25.

The control signal EN is provided to the gate of the NMOS transistor NL24. The control signal EN is inverted by the inverter circuit formed by the PMOS transistor PL24 and the NMOS transistor NL26, and the inverted signal is provided to the gate of the NMOS transistor NL25.

In the level conversion circuit 35 of the seventh embodiment, the gate potential of the PMOS transistor PH25 generated in the bias circuit 32 is provided to the gate of the PMOS transistor PH50, which forms a current mirror circuit together with the PMOS transistor PH25. A current according to the gate potential of the PMOS transistor PH50 flows through the NMOS transistor NH28. The gate potential of the NMOS transistor NH28 is transferred to the gate of the NMOS transistor NH29 via the NMOS transistor NL24, which is turned on based on a H level control signal EN. A current flowing through the NMOS transistor NH29 is converted into a voltage (a potential of the node 30) in the PMOS transistor PH27. The resulting voltage is then provided to the gate of the PMOS transistor PH3 of the bias circuit 31. The PMOS transistor PH3 is turned on, and a bias current flows through the PMOS transistor PH3 and the NMOS transistor NH3.

In the level conversion circuit 35, the MOS transistors PH25, PH26, NH28 NH29, and PH3 are designed so that current flowing through the bias circuit 32 is reduced to an amount sufficient for practical use and the current flowing through the PMOS transistor PH3 in the bias circuit 31 is set at a required amount.

In the level conversion circuit 35, the gate potential of the NMOS transistor NH28 is transferred to the NMOS transistor NH29 by the NMOS transistor NL24. Thus, only when the control signal EN is at a H level, the NMOS transistor NL24 is turned on and the gate potential of the NMOS transistor NH28 is transferred so that current flows through the NMOS transistor NH29. When the control signal EN is at a L level, the gate potential of the NMOS transistor NH28 is not transferred to the NMOS transistor NH29, and the NMOS transistor NL25 is turned on. The gate of the NMOS transistor NH29 is connected to the ground. Thus, no current flows through the NMOS transistor NH29. The level conversion circuit 30 controls the bias current of the bias circuit 31 based on the control signal EN having a signal amplitude of 1.8 V.

An additional PMOS transistor for allowing current to flow when the control signal EN is at a L level may be connected in parallel with the PMOS transistor PH3 of the bias circuit 31. The gate of the additional PMOS transistor may be connected to the gate of the PMOS transistor PH25.

Eighth Embodiment

The following describes a level conversion circuit 40 according to an eighth embodiment of the present invention.

Figure 18:
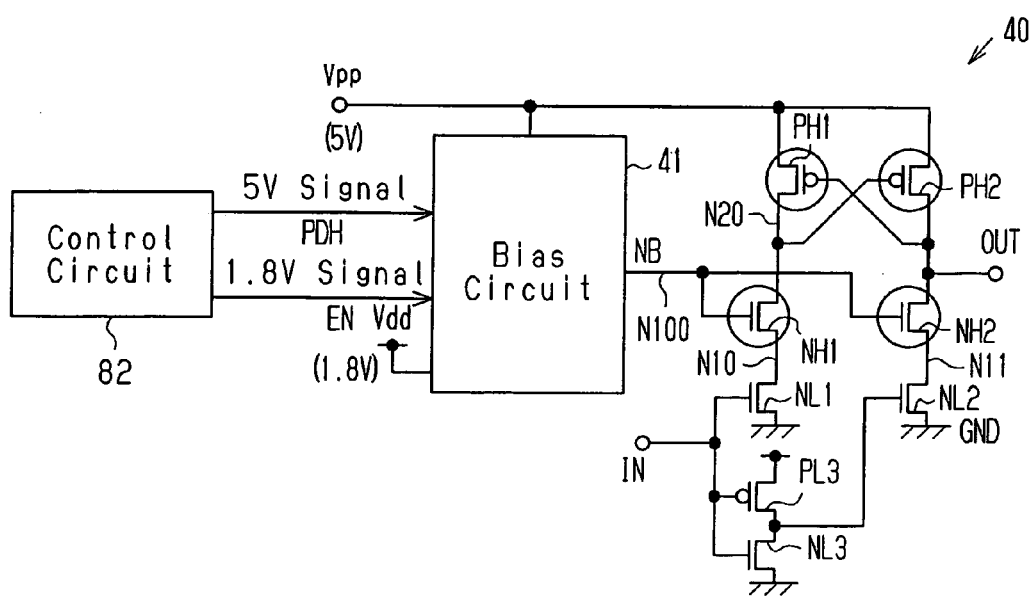
FIG. 18 is a schematic diagram describing the principle of an eighth embodiment of the present invention.

FIG. 18 is a schematic diagram describing the principle of the eighth embodiment. In the eighth embodiment, the level conversion circuit 40 is connected to a control circuit 82. The control circuit 82 generates a control signal EN with a low power supply voltage Vdd (1.8 V) and a control signal PDH with a high power supply voltage Vpp (5 V). The level conversion circuit 40 of the eighth embodiment controls on and off of the bias current of the bias circuit 41 during normal operation based on the control signal EN with the low power supply voltage Vdd (1.8 V). The level conversion circuit 40 controls on and off of the bias current of the bias circuit 41 during standby based on the control signal PDH with the high power supply voltage Vpp (5 V).

Figure 19:
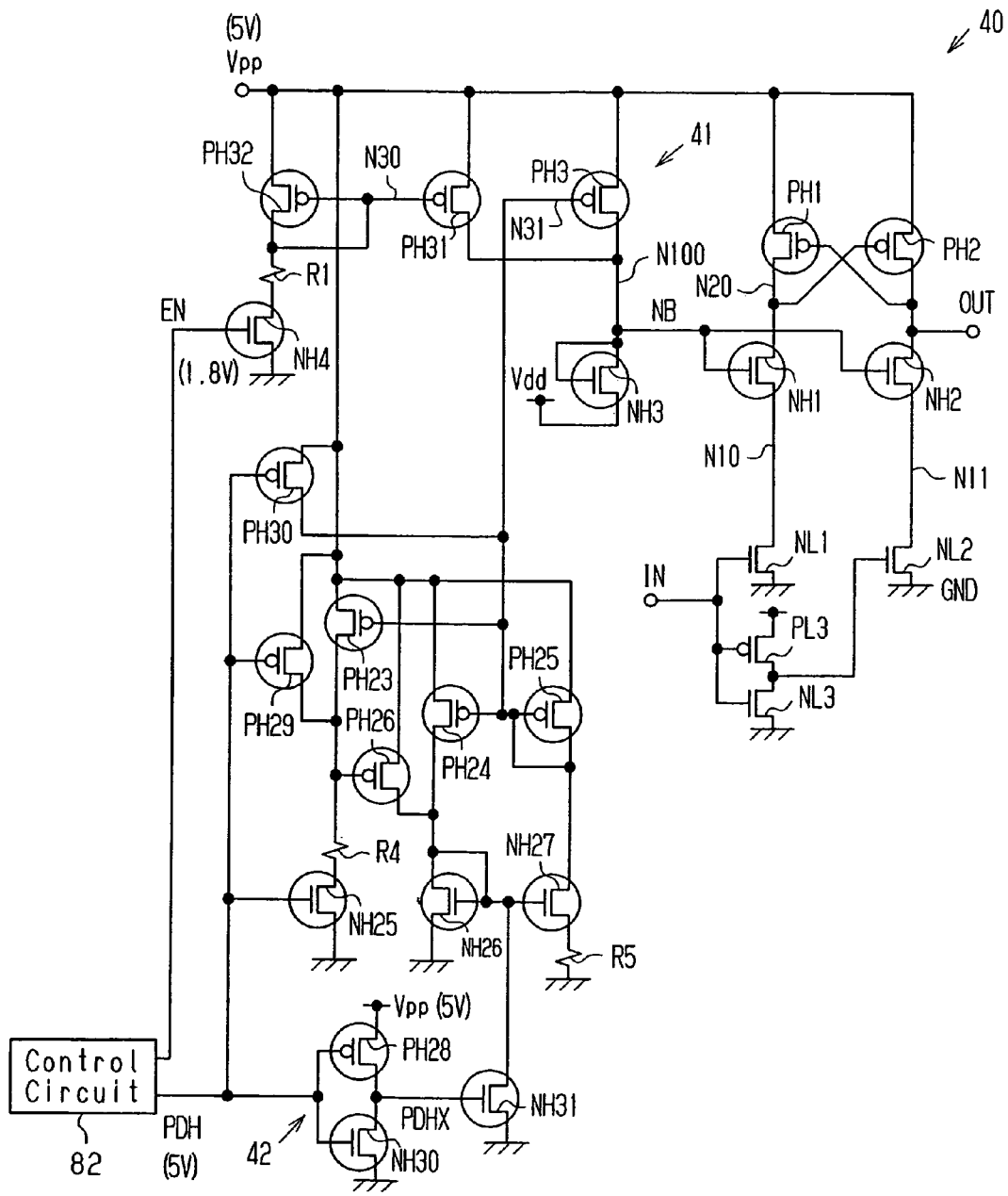
FIG. 19 is a schematic circuit diagram showing a level conversion circuit according to the eighth embodiment of the present invention.

FIG. 19 is a schematic circuit diagram showing the level conversion circuit 40 of the eighth embodiment.

The control circuit 82 for generating the 1.8 V control signal EN and the 5 V control signal PDH is connected to the level conversion circuit 40. The level conversion circuit 40 uses the 5 V control signal PDH as a replacement for the control signal EN used in the level conversion circuit 30 of the sixth embodiment (refer to FIG. 16). The level conversion circuit 40 generates current of which on an off are controlled based on the 1.8 V control signal EN using the resistor R1 in the same manner as the level conversion circuit 10 of the first embodiment (refer to FIG. 7). In FIG. 19, components that are the same as the corresponding components in the first and sixth embodiments are given the same reference numerals as those components.

The level conversion circuit 40 includes, in addition to the circuit components forming the bias circuits 31 and 32, high voltage capacity PMOS transistors PH28, PH29, PH30, PH31, and PH32, high voltage capacity NMOS transistors NH4, NH30, and NH31, and a resistor R1.

The PMOS transistor PH28 and the NMOS transistor NH30 form an inverter circuit 42. The inverter circuit 42 inverts a 5 V control signal PDH to generate a control signal PDHX. The control signal PDHX is provided to the gate of the NMOS transistor NH31. The drain of the NMOS transistor NH31 is connected to the gates of the NMOS transistor NH26 and NH27. The source of the NMOS transistor NH31 is connected to the ground.

The 5 V control signal PDH is provided to the gate of each of the PMOS transistors PH29 and PH30 and the NMOS transistor NH25. The power supply voltage Vpp is provided to the source of the PMOS transistor PH29. The drain of the PMOS transistor PH29 is connected to the gate of the PMOS transistor PH26. The power supply voltage Vpp is provided to the source of the PMOS transistor PH30. The drain of the PMOS transistor PH30 is connected to the gates of the PMOS transistors PH3, PH23, PH24, and PH25.

The source of each of the PMOS transistors PH31 and PH32 is provided with a power supply voltage Vpp of 5 V. The gate of the PMOS transistor PH31 and the gate of the PMOS transistor PH32 are connected to each other. The gates of the PMOS transistor PH31 and the PMOS transistor PH32 are connected to the drain of the PMOS transistor PH32.

The drain of the PMOS transistor PH32 is connected to the drain of the NMOS transistor NH4 via the resistor R1. The source of the NMOS transistor NH4 is connected to the ground. The gate of the NMOS transistor NH4 is provided with a 1.8 V control signal EN. The drain of the PMOS transistor PH31 is connected to the connecting node (drains) of the PMOS transistor PH3 and the NMOS transistor NH3.

The following describes the operation of the level conversion circuit 40 of the eighth embodiment.

During operation of the level conversion circuit 40, a H level (1.8 V) control signal EN is provided to the gate of the NMOS transistor NH4, so that the NMOS transistor NH4 is turned on. The gate of the PMOS transistor PH32 is set at the ground potential. Here, a current flows through the resistor R1 and the PMOS transistor PH32. Then, a current also flows through the PMOS transistor PH31 connected to form a current mirror circuit together with the PMOS transistor PH32. The current further flows to the power supply with the low power supply voltage Vdd, via the diode-connected NMOS transistor NH3. As a result, the bias potential NB of the bias circuit 41 is set at a voltage higher than the power supply voltage Vdd by substantially the threshold voltage Vth of the high voltage capacity NMOS transistor NH3.

During standby of the level conversion circuit 40, a L level (0 V) control signal EN is provided to the gate of the NMOS transistor NH4, so that the NMOS transistor NH4 is turned off. A current flowing through the PMOS transistor PH31 is stopped. During standby, the control signal PDH controls on and off of a current flowing through the PMOS transistor PH3.

To be specific, when the control signal PDH is at a H level (the control signal PDHX is at a L level), the NMOS transistor NH31, and the PMOS transistors PH29 and PH30 are turned off, and the NMOS transistor NH25 is turned on. With the NMOS transistor NH25 being on, a current flows through a self-bias circuit formed by the PMOS transistors PH24 and PH25, the NMOS transistors NH26 and NH27, and the resistor R5. The current further flows from the self-bias circuit through the PMOS transistor PH3.

When the control signal PDH is at a L level (or the control signal PDHX is at a H level), the NMOS transistor NH31 is turned on, and the NMOS transistors NH26 and NH27 are turned off. Also, the PMOS transistors PH29 and PH30 are turned on, and the PMOS transistors PH23 to PH26 are turned off. This stops the current flowing through the self-bias circuit, and also stops the current flowing through the PMOS transistor PH3.

In the eighth embodiment, the on and off control of the bias current during standby may be executed using a 1.8 V control signal instead of a 5 V control signal PDX.

This enables the control for lowering an impedance of the bias circuit 41, which generates the bias potential NB, for example, only during a period when the input and output signals of the level conversion circuit 40 frequently change. This control is executed using a circuit operable at the low power supply voltage Vdd (digital circuit). As one example, a semiconductor integrated circuit device may include a CPU operable at the power supply voltage Vdd. In this semiconductor integrated circuit device, the CPU controls a current flowing through the bias circuit 41 by executing a program. The bias current during standby may be stopped based on the control signal PDH when the circuit does not operate at all, e.g., at the time of testing such as the IDDQ measurement.

Ninth Embodiment

The following describes a level conversion circuit 43 according to a ninth embodiment of the present invention.

Figure 20:
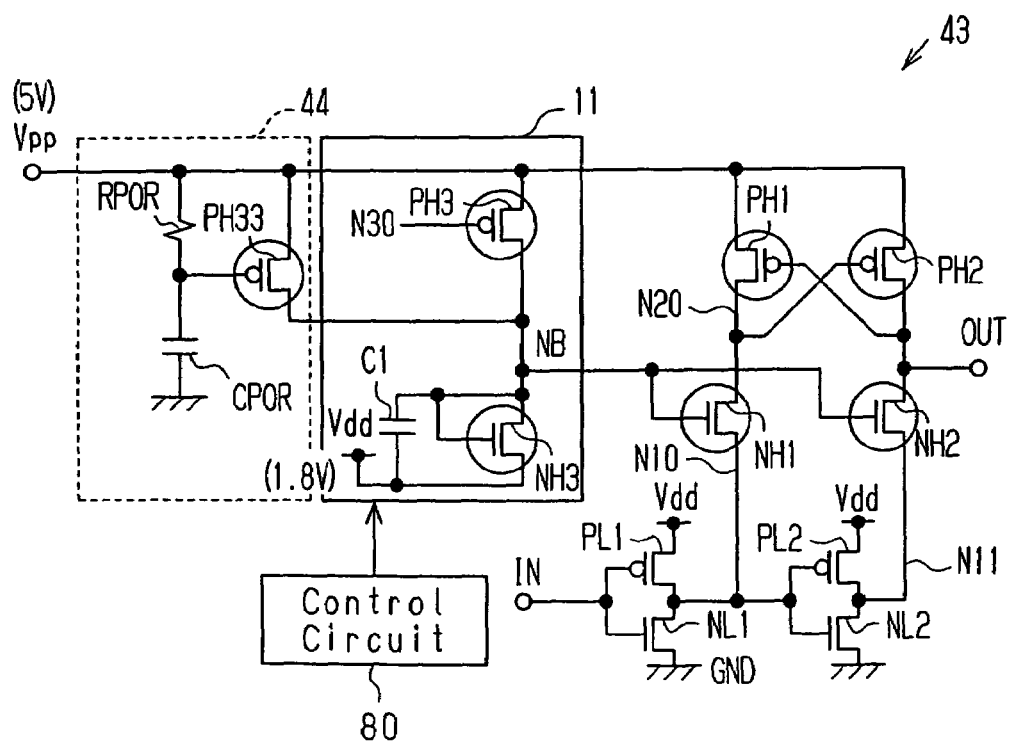
FIG. 20 is a schematic circuit diagram showing a level conversion circuit according to a ninth embodiment of the present invention.

FIG. 20 shows the level conversion circuit 43 according to the ninth embodiment. In the level conversion circuit 10 of the first embodiment, the power-on reset function is realized by the capacitor CPOR connected to the node N30. In the level conversion circuit 43 of the ninth embodiment, a power-on reset circuit 44 is separately arranged to realize the power-on reset function. In FIG. 20, components that are the same as the corresponding components in the first embodiment (refer to FIG. 7) are given the same reference numerals as those components. The following describes the ninth embodiment focusing on its differences from the first embodiment.

The power-on reset circuit 44 includes a PMOS transistor PH33, a resistor RPOR, and a capacitor CPOR. In the power-on reset circuit 44, the resistor RPOR and the capacitor CPOR are connected to each other. The gate of the PMOS transistor PH33 is connected to the connecting node of the resistor RPOR and the capacitor CPOR. The source of the PMOS transistor PH33 is provided with a power supply voltage Vpp of 5 V. The drain of the PMOS transistor PH33 is connected to the connecting node (drains) of the PMOS transistor PH3 and the NMOS transistor NH3.

At the rise of the power supply voltage Vpp, the gate voltage of the PMOS transistor PH3 is set at 0 V by the capacitor CPOR. This causes the PMOS transistor PH3 to be on and causes a current to flow through the NMOS transistor NH3. The bias potential NB is charged regardless of the gate potential (the potential of the node 30) of the PMOS transistor PH3. The gate of the PMOS transistor PH33 is charged according to a time constant determined by the capacitor CPOR and the resistor RPOR. Then, the PMOS transistor PH33 is finally turned off.

The power-on procedures of the power supply voltages Vpp and Vdd is such that the power supply voltage Vdd rises first, and then the power supply voltage Vpp rises (refer to FIG. 6). The power-on reset circuit 44 charges the bias potential NB at the rise of the power supply voltage Vpp. This minimizes a period where the output of the level conversion circuit 43 is undetermined. The power-on procedures in FIG. 6 minimize the period in which the output of the level conversion circuit 43 is undetermined. When the power-on procedures are unnecessary (when, for example, a circuit receiving the output of the level conversion circuit 43 is arranged to determine the output), the power-on procedures may be appropriately changed.

Tenth Embodiment

A level conversion circuit 45 according to a tenth embodiment of the present invention will now be described.

Figure 21:
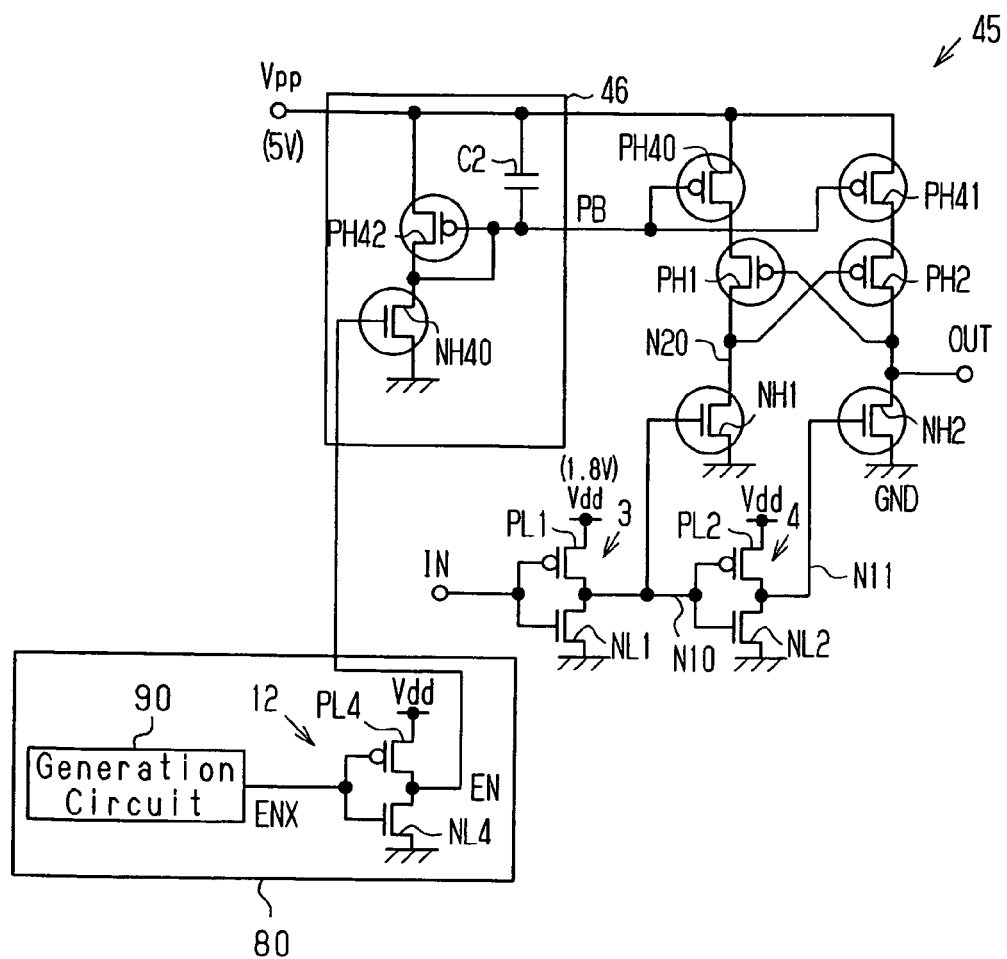
FIG. 21 is a schematic circuit diagram showing a level conversion circuit according to a tenth ninth embodiment of the present invention.

FIG. 21 shows the level conversion circuit 45 of the tenth embodiment.

Figure 1:
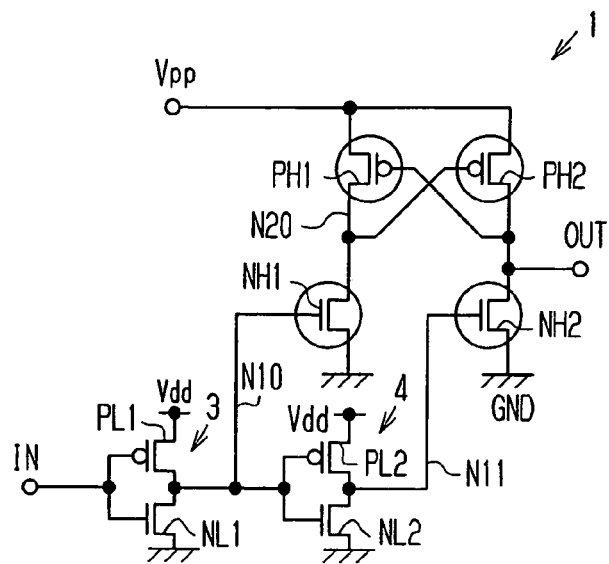
FIG. 1 is a schematic circuit diagram showing a level conversion circuit according to a first conventional example.

The level conversion circuit 45 differs from the prior art example shown in FIG. 1 in that it is provided with high voltage capacity PMOS transistors PH40 and PH41 for current restriction and a bias circuit 46 for supplying a bias potential PB to each transistor PH40 and PH41. In FIG. 21, the components (MOS transistors PH1, PH2, NH1, NH2, and inverter circuits 3, 4 and the like) which are identical to those of the prior art example in FIG. 1 are denoted with the same reference numbers.

For the output signal OUT to shift from the H level to the L level, the current of the NMOS transistor NH2 must be greater than the current of the PMOS transistor PH2 as in the previously described level conversion circuit 1 of FIG. 1. The gate-source voltage of the NMOS transistor NH2 is only 1.8 V (power supply voltage Vdd) compared to the gate-source voltage of the PMOS transistor PH2 which is 5 V (power supply voltage Vpp). In order to increase the current of the NMOS transistor NH2 so as to be greater than the current of the PMOS transistor PH2, the gate width W of the NMOS transistor NH2 must be increased (so as to be greater than the gate width of the transistor PH2). In this case, the size of the NMOS transistor NH2 must be increased. In addition, when the value of the power supply voltage Vdd is reduced to near the threshold value of the voltage Vth of the transistor NH2, the delay time is greatly increased. This situation occurs because there is a small difference between the current flowing through the PMOS transistor PH2 and the current flowing through the NMOS transistor NH2, which contribute to discharge from the output terminal of the output signal OUT, even if the gate width W of the NMOS transistor NH1 and NH2 is large.

The level conversion circuit 45 of the tenth embodiment solves these problems by having the current restriction PMOS transistors PH40 and PH41 connected in series with the cross-coupled high voltage capacity PMOS transistors PH1 and PH2. A bias potential PB generated by the bias circuit 46 is supplied to the gates of the PMOS transistors PH40 and PH41, such that the current flowing to the PMOS transistors PH40 and PH41, that is, the PMOS transistors PH1 and PH2, is controlled. The current flowing to the PMOS transistors PH40, PH41, PH1, and PH2 is proportional to the current flowing through the NMOS transistors NH1 and NH2 when the power supply voltage Vdd is applied to the gates of the high voltage capacity NMOS transistors NH1 and NH2.

More specifically, the bias circuit 46 includes a capacitor C2 and a high voltage capacity PMOS transistor PH42 and NMOS transistor NH40. The power supply voltage Vpp is supplied to the source of the PMOS transistor PH42. The gate of the PMOS transistor PH42 is connected to the drains of the MOS transistors PH42 and NH40 and to the power supply of the power supply voltage Vpp through the capacitor C2. The capacitor C2 operates as a stabilization capacitor of the bias potential PB output from the bias circuit 46 (gate of the PMOS transistor PH42).

The source of the NMOS transistor NH40 is connected to the ground, and a control signal EN output from the inverter circuit 12 is supplied to the gate of the NMOS transistor NH40. The gate of the PMOS transistor PH42 is connected to the gates of the current restriction PMOS transistors PH40 and PH41.

In this circuit configuration, the currents flowing to the PMOS transistors PH40, PH41, PH1, and PH2 are proportional to the currents flowing to the NMOS transistors NH1 and NH2 when the power supply voltage Vdd is applied to the gates of the high voltage capacity NMOS transistors NH1 and NH2. That is, when the power supply voltage Vdd drops, the current of the NMOS transistors NH1 and NH2 decreases, and the current of the NMOS transistor NH40 of the bias circuit 46 also decreases. Since the current flowing to the NMOS transistor NH40 decreases, the current flowing to the PMOS transistor PH42 decreases. Accordingly, the currents flowing to the PMOS transistors PH40, PH41, PH1, and PH2 are proportional to the currents of the NMOS transistors NH1 and NH2. Since the level conversion circuit 45 has these characteristics, the current of the NMOS transistor NH2 is constantly larger than the current of the PMOS transistor PH2 even when the power supply current Vdd decreases.

When the control signal EN is set to L level, the NMOS transistor NH40 is turned off, and the current stops flowing to the bias circuit 46. This time, since the PMOS transistors PH40 and PH41 are turned off, there is a possibility that the signal level of the output signal OUT is indeterminate. Therefore, the reception circuit, which receives the output signal OUT from the level conversion circuit 45 has a logic function based on the control signal so as to determine the output signal OUT or so that a through current does not flow to the reception circuit even when the output signal OUT is an intermediate potential.

In the tenth embodiment, the current restriction PMOS transistors PH40 and PH41 are inserted in the source side of the PMOS transistors PH1 and PH2. Instead, the current restriction PMOS transistors PH40 and PH41 may be provided on the drain side of the PMOS transistors PH1 and PH2.

Eleventh Embodiment

A level conversion circuit 48 according to an eleventh embodiment of the present invention is described below.

Figure 22:
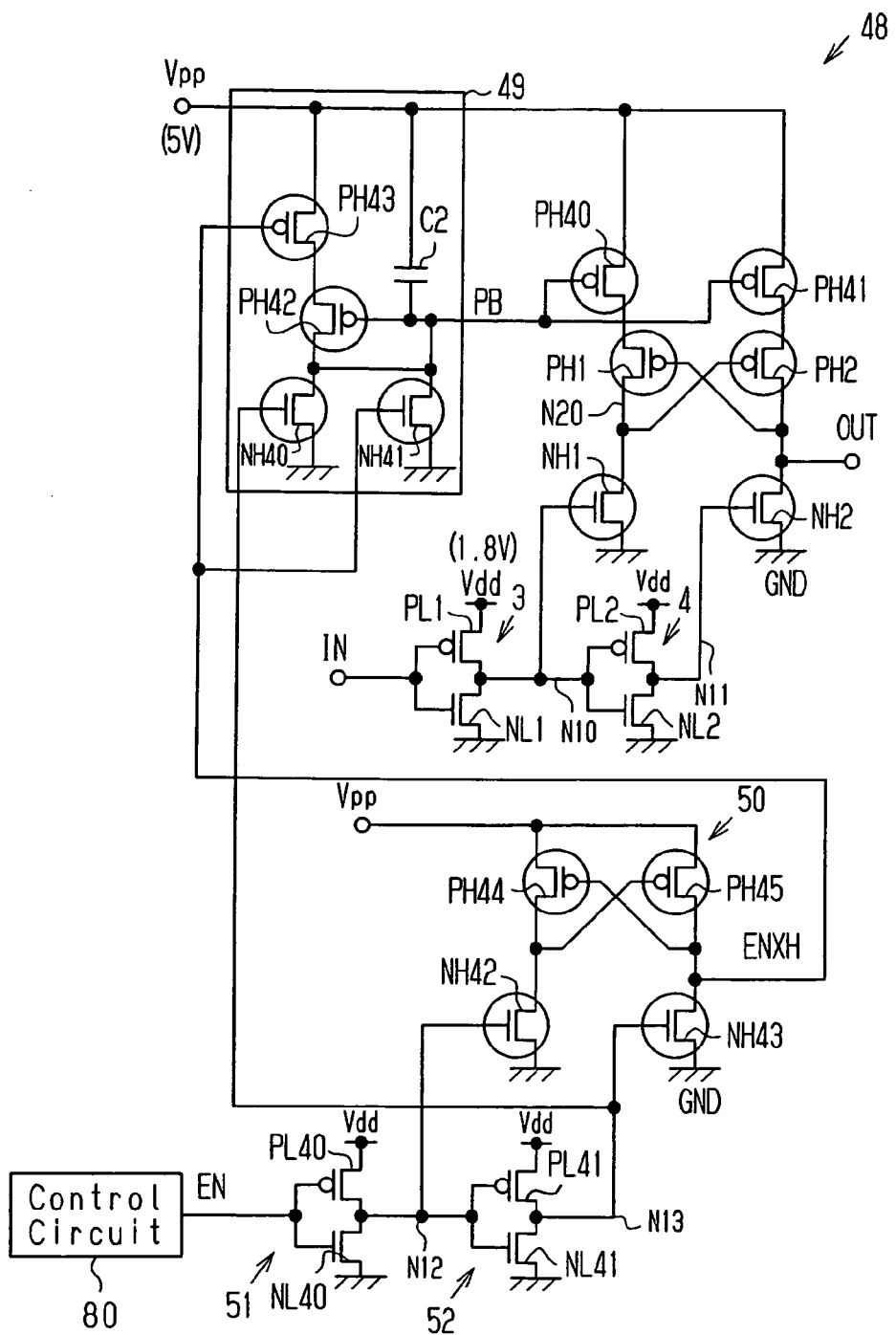
FIG. 22 is a schematic circuit diagram showing a level conversion circuit according to an eleventh embodiment of the present invention.

FIG. 22 shows the level conversion circuit 48 of the eleventh embodiment. In the level conversion circuit 48, the bias circuit 49 and the circuit controlling the bias circuit 49 (circuit including the level conversion circuit 50) differ from the level conversion circuit 45 of the tenth embodiment. In FIG. 22, the components which are identical to those of the tenth embodiment are denoted with the same reference numbers. The differences will be described below.

In the tenth embodiment, current stops flowing to the bias circuit 46 when the NMOS transistor NH40 is turned off. There is a possibility that the output is set to high impedance (output signal OUT not determined) when the PMOS transistors PH40 and PH41 are turned off at the same time as when the flow of current stops. In the level conversion circuit 48 of the eleventh embodiment, the output cannot be set to high impedance even when the current of the bias circuit 49 is stopped.

More specifically, the bias circuit 49 is provided with a PMOS transistor PH43 and NMOS transistor NH41 in addition to the PMOS transistor PH42, the NMOS transistor NH40, and the capacitor C2. A 5 V power supply voltage Vpp is supplied to the source of the PMOS transistor PH43. The drain of the PMOS transistor PH43 is connected to the source of the PMOS transistor PH42. The drain of the NMOS transistor NH41 is connected to the gate of the PMOS transistor PH42, and the source of the NMOS transistor NH41 is connected to the ground. An output signal ENXH (5 V control signal) of a level conversion circuit 50 is supplied to the gates of the PMOS transistor PH43 and the NMOS transistor NH41. The level conversion circuit 50 includes PMOS transistors PH44 and PH45, NMOS transistors NH42 and NH43, and inverter circuits 51 and 52.

A PMOS transistor PL40 and an NMOS transistor NL40 form the inverter circuit 51. A PMOS transistor PL41 and NMOS transistor NL41 form the inverter circuit 52. When the control signal EN is H level (1.8 V), the output node N12 of the inverter circuit 51 is set to L level (0 V), and the output node N13 of the inverter circuit 52 is set to H level (1.8 V). At this time, the level conversion circuit 50 outputs an L level (0 V) control signal ENXH because the NMOS transistor NH43 and the PMOS transistor PH44 are turned on and the NMOS transistor NH42 and the PMOS transistor PH45 are turned off.

Since the control signal ENXH is L level, the NMOS transistor NH41 is turned off, and the PMOS transistor PH43 is turned on. Accordingly, when the control signal ENXH is L level, the bias circuit 49 operates in the same manner as the bias circuit 46 of FIG. 21. In this case, a current flows to the NMOS transistor NH40 because the node N13 is H level. In the same manner as the bias circuit 46, the level conversion circuit 48 may be designed such that the currents flowing to the NMOS transistors NH1 and NH2 are proportional to the current of the NMOS transistor NH40 when the power supply voltage Vdd is applied to the gates of the high voltage capacity NMOS transistors NH1 and NH2. Similarly, the level conversion circuit 48 may be designed such that the currents flowing to the PMOS transistors PH40, PH41, PH1, and PH2 are proportional to the currents of the NMOS transistors NH1 and NH2.

When the control signal EN is L level (0 V), the output node N12 of the inverter circuit 51 is set to H level (1.8 V), and the output node N13 of the inverter circuit 52 is set to L level (0 V). At this time, the level conversion circuit 50 outputs an H level (5 V) control signal ENXH because the NMOS transistor NH42 and the PMOS transistor PH45 are turned on, and the NMOS transistor NH43 and the PMOS transistor PH44 are turned off.

Since the control signal ENXH is H level, the NMOS transistor NH41 is turned on, and the PMOS transistor PH43 is turned off. When the PMOS transistor PH43 is turned off, stationary current does not flow to the bias circuit 49. At this time, the bias potential PB is set to 0 V ground potential, and the current restriction PMOS transistors PH40 and PH41 are turned on by the turning ON the NMOS transistor NH41. When the bias potential supplied to the gates of the PMOS transistors PH40 and PH41 is 0 V, the currents flowing to the PMOS transistors PH40 and PH41 are not proportional to the currents of the NMOS transistors NH1 and NH2 during the change of the input signal IN and output signal OUT. Nevertheless, this condition is maintained if there is no change in the input signal IN and output signal OUT. Accordingly, the current flowing to the bias circuit 49 is stopped when there is no change in the input/output signals of the level conversion circuit 48 (standby time).

To generate a 5 V control signal ENXH from the 1.8 V control signal EN in the eleventh embodiment, a level conversion circuit 50 is used which has a configuration similar to that of the prior art example in FIG. 1. When the power supply voltage Vdd decreases, the delay time increases for the control signal ENXH generated by the level conversion of the control signal EN. However, since the control signal ENXH is just a control signal, there is no problem in circuit operation even if the delay time of the control signal ENXH increases somewhat. In this case, in the level conversion circuit 50, it is desirable that the ON resistance of the PMOS transistors PH44 and PH45 is increased as much as possible, the surface area of the transistors is restricted, the gate width of the NMOS transistors NH42 and NH43 is increased, and the lower limit of their operating voltages is made as low as possible.

In the level conversion circuit 48 having the above described configuration, the value of the current flowing to the PMOS transistors PH40, PH41, PH1, and PH2 is proportional to the current flowing to the NMOS transistors NH1 and NH2 when the power supply voltage Vdd is added to the high voltage capacity NMOS transistors NH1 and NH2. Furthermore, it is possible to stop the current of the bias circuit 49 which flows during standby.

Twelfth Embodiment

A level conversion circuit 55 according to a twelfth embodiment of the present invention is described below.

Figure 23:
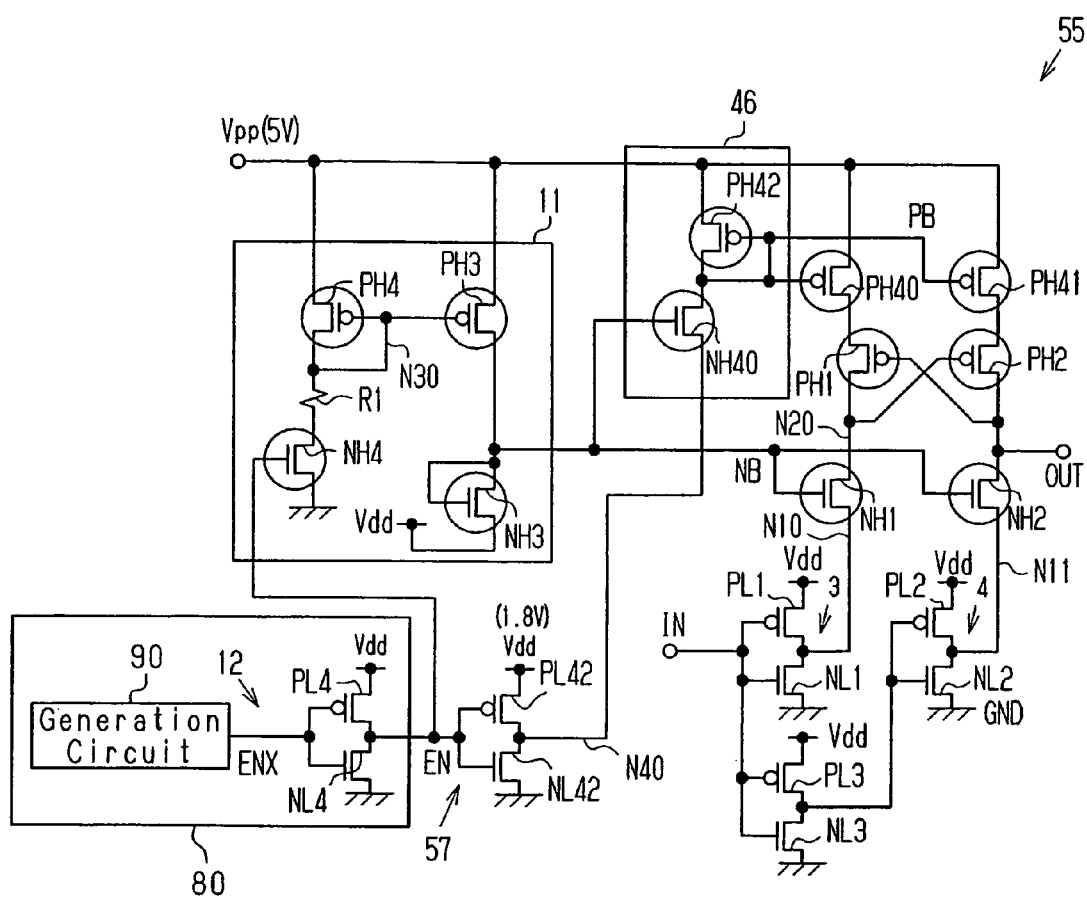
FIG. 23 is a schematic circuit diagram showing a level conversion circuit according to a twelfth embodiment of the present invention.

FIG. 23 shows the level conversion circuit 55 of the twelfth embodiment. The level conversion circuit 55 combines the level conversion circuit 10 (refer to FIG. 7) of the first embodiment and the level conversion circuit 45 (refer to FIG. 21) of the tenth embodiment. In the level conversion circuit 55, the method of generating the bias potential PB in the bias circuit 46 differs from the generation method in the previously described level conversion circuit. In FIG. 23, parts common to the first and tenth embodiments are denoted with like reference numbers, and the following description focuses on the different parts.

In the level conversion circuit 55, a bias potential NB generated by a bias circuit 11 is supplied to the gate of the NMOS transistor NH40 of the bias circuit 46. A PMOS transistor PL42 and an NMOS transistor NL42 form an inverter circuit 57. The source of the NMOS transistor NH40 is connected to the output node N40 of the inverter circuit 57. A control signal EN from the inverter circuit 12 is supplied to the inverter circuit 57. The inverter circuit 57 inverts the control signal EN, and the inverted control signal is output to the output node N40.

In the level conversion circuit 45 of FIG. 21, when the input signal changes, a power supply voltage Vdd is applied to the gates of the NMOS transistors NH1 and NH2, and current flows to the high voltage capacity NMOS transistors NH1 and NH2. In the level conversion circuit 45, the value of the current flowing to the PMOS transistors PH40, PH41, PH1, and PH2 is proportional to the current flowing to the NMOS transistors NH1 and NH2 when the power supply voltage Vdd is applied to the gates of the NMOS transistors NH1 and NH2.

In the level conversion circuit 55 of the twelfth embodiment shown in FIG. 23, when the input signal changes, a power supply voltage Vdd plus a threshold voltage Vth are applied to the gates of the NMOS transistors NH1 and NH2, and a current corresponding to this gate voltage flows to the NMOS transistors NH1 and NH2. Accordingly, the value of the current flowing to the PMOS transistors PH40, PH41, PH1, and PH2 is proportional to the current flowing to the NMOS transistors NH1 and NH2 when the power supply voltage Vdd plus the threshold voltage Vth are applied to the gates of the NMOS transistors NH1 and NH2.

Therefore, the level conversion circuit 55 is configured such that the current flowing to the PMOS transistor PH42, which is connected to a diode generating the bias voltage PB, is proportional to the current flowing to the NMOS transistors NH1 and NH2 when the power supply voltage Vdd plus the threshold voltage Vth are applied to the gates of the NMOS transistors NH1 and NH2.

More specifically, in the level conversion circuit 45 of FIG. 21, the source of the NMOS transistor NH40 in the bias circuit 46 is connected to the ground GND, and the gate potential of the NMOS transistor NH40 (during operation of the bias circuit 46) is set to the power supply voltage Vdd. In the level conversion circuit 55 of the twelfth embodiment, the gate potential of the NMOS transistor NH40, that is, the bias potential NB, is set to the power supply voltage Vdd plus the threshold voltage Vth. The source of the NMOS transistor NH40 is connected to the ground GND through the NMOS transistor NH42. Thus, the NMOS transistors NH1 and NH2 and the NMOS transistors NL1 and NL2 operate as a replica circuit.

In the level conversion circuit 55, when an H level control signal EN is supplied, the inverter circuit 57 sets the potential of the output node N40 to L level (0 V). Then, a power supply voltage Vdd plus a threshold voltage Vth is applied between the gate and source of the NMOS transistor NH40. At this time, in the bias circuit 46, the NMOS transistor NH40 is turned on, a current flows to the PMOS transistor PH42, and a bias potential PB is generated. Accordingly, the value of the current flowing to the PMOS transistors PH40, PH41, PH1, and PH2 is proportional to the current flowing to the NMOS transistors NH1 and NH2 when the power supply voltage Vdd plus the threshold voltage Vth is applied to the gates of the NMOS transistors NH1 and NH2, In this way, the operating speed of the level conversion circuit 55 is increased in the twelfth embodiment because the bias potential NB generated by the bias circuit 11 is higher than the power supply voltage Vdd by only the threshold voltage Vth (2.6 V) in the same manner as in the first embodiment. Furthermore, the current of the NMOS transistor NH2 is constantly larger than the current of the PMOS transistor PH2 even when the power supply voltage Vdd decreases.

Thirteenth Embodiment

A level conversion circuit 61 according to a thirteenth embodiment of the present invention is described below.

Figure 24:
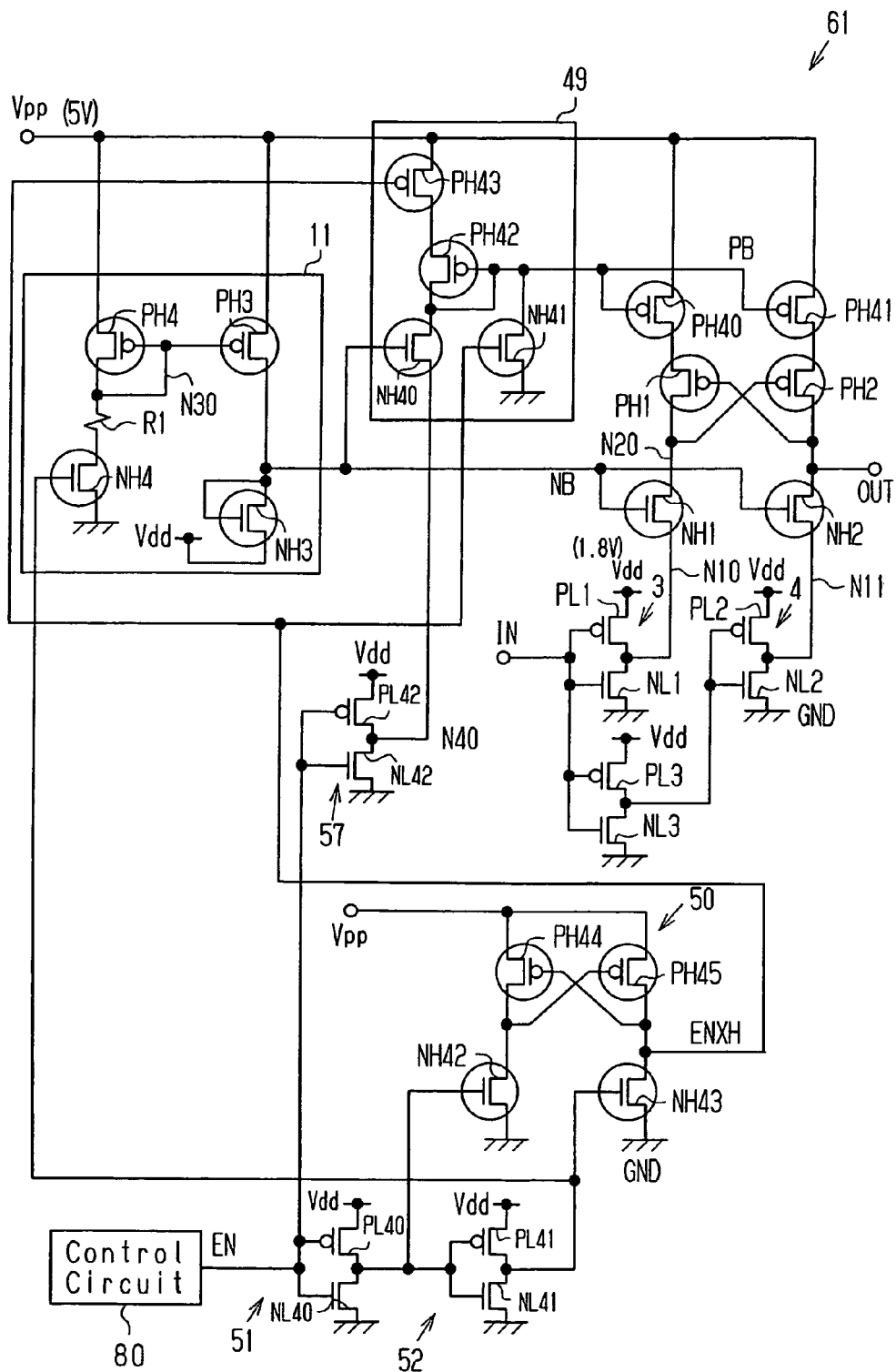
FIG. 24 is a schematic circuit diagram showing a level conversion circuit according to a thirteenth embodiment of the present invention.

FIG. 24 shows the level conversion circuit 61 of the thirteenth embodiment. The level conversion circuit 61 combines the level conversion circuit 10 (refer to FIG. 7) of the first embodiment and the level conversion circuit 48 (refer to FIG. 22) of the eleventh embodiment. In FIG. 24, components common to the first and eleventh embodiments (refer to FIGS. 7 and 22) are denoted by like reference numbers.

In the level conversion circuit 61, the output signal OUT is determined even when the bias current to the bias circuit 49 is stopped in the same manner as in the eleventh embodiment. The level conversion circuit 61 includes the MOS transistors PH43 and NH41 of the bias circuit 49 and the level conversion circuit 50 in addition to the level conversion circuit 55 of the twelfth embodiment.

In the level conversion circuit 61, the current flowing to the PMOS transistors PH40, PH41, PH1, and PH2 is proportional to the current flowing to the NMOS transistors NH1 and NH2 when the power supply voltage Vdd plus the threshold voltage Vth is applied to the gates of the high voltage capacity NMOS transistors NH1 and NH2 in the same manner as in the twelfth embodiment. Further, the current flowing through the bias circuit 49 in a standby state may be stopped.

Fourteenth Embodiment

A level conversion circuit according to a fourteenth embodiment of the present invention is described below.

Figure 25:
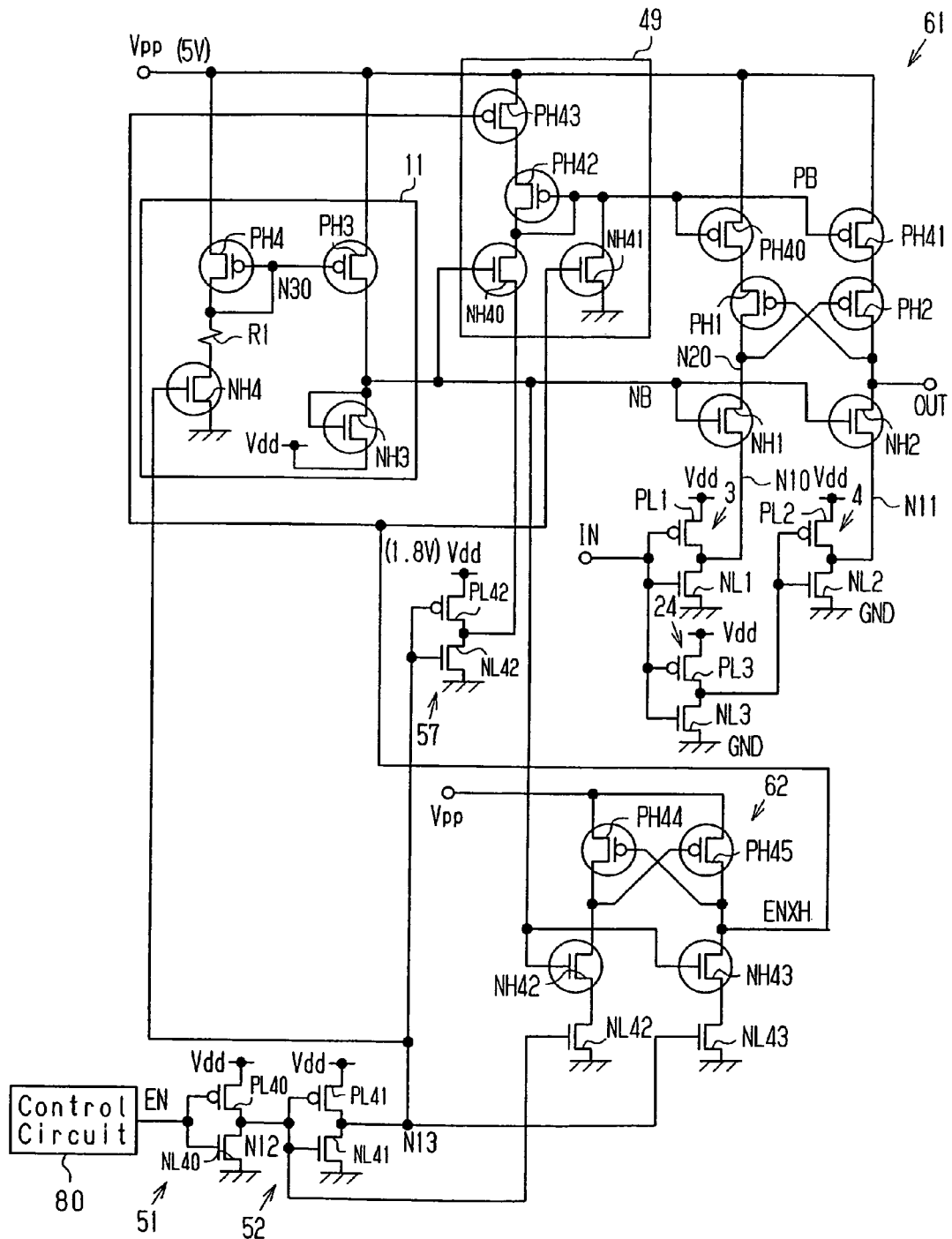
FIG. 25 is a schematic circuit diagram showing a level conversion circuit according to a fourteenth embodiment of the present invention.

In the fourteenth embodiment shown in FIG. 25, the level conversion circuit 62, which generates a 5 V control signal ENXH from the 1.8 V control signal EN, differs from the level conversion circuit 50 of the thirteenth embodiment. In FIG. 25, parts common to the configuration of the thirteenth embodiment are denoted with like reference numbers, and the different parts will be described below.

In the level conversion circuit 62, a bias potential (Vdd+Vth) generated by the bias circuit 11 is supplied to the gates of the NMOS transistors NH42 and NH43. The source of the NMOS transistor NH42 is connected to the ground through a low voltage capacity NMOS transistor NL42. The source of the NMOS transistor NH43 is connected to the ground through the low voltage capacity NMOS transistor NL43. The gate of the NMOS transistor NL42 is connected to the output node N12 of the inverter circuit 51. The gate of the NMOS transistor NL43 is connected to the output node N13 of the inverter circuit 52. A potential having a level identical to that of the control signal EN is supplied to the gate of the NMOS transistor NL43.

After the flow of current to the bias circuit 49 is stopped, when the power supply voltage Vdd drops and the level conversion circuit 62, which generates the control signal ENXH, stops operating, the bias circuit 49 is not restored. Accordingly, the bias current cannot be stopped.

To cope with this problem, the gate potential of the NMOS transistors NH42 and NH43 is set to the bias voltage (Vdd+Vth), such that the lower limit of the operating voltage is reduced. That is, when the power supply voltage drops, the amount by which the current of the transistors NH42 and NH43 is decreased is less than that of the level conversion circuit 50 of FIG. 24. Accordingly, even when the power supply voltage Vdd drops, the level conversion circuit 62 operates to generate a 5 V control signal ENXH from the 1.8 V control signal EN. That is, the power supply voltage Vdd can control the bias circuit 49 over a broad voltage range.

Furthermore, since the bias circuit 49 can be controlled over a broad voltage range by the control signal EN (that is, the voltage range of the power supply voltage which can be restored by the control signal EN after the bias circuit 49 is stopped), the bias circuit 49 can be stopped with greater frequency.

The eleventh embodiment described a method for increasing as much as possible the ON resistance of the PMOS transistors PH44 and PH45, restricting the transistor surface area, and increasing the gate widths W of the NMOS transistors NH42 and NH43 so as to reduce the lower limit of the operating voltage of the level conversion circuit 50 which generates a 5 V control signal ENXH from a 1.8 V control signal EN. Furthermore, in the level conversion circuit 62 of the fourteenth embodiment, the lower limit of the operating voltage is reduced below that of the eleventh embodiment by supplying a bias potential NB (Vdd+Vth) to the NMOS transistors NH42 and NH43.

Fifteenth Embodiment

A fifteenth embodiment of the present invention is described below.

Figure 26:
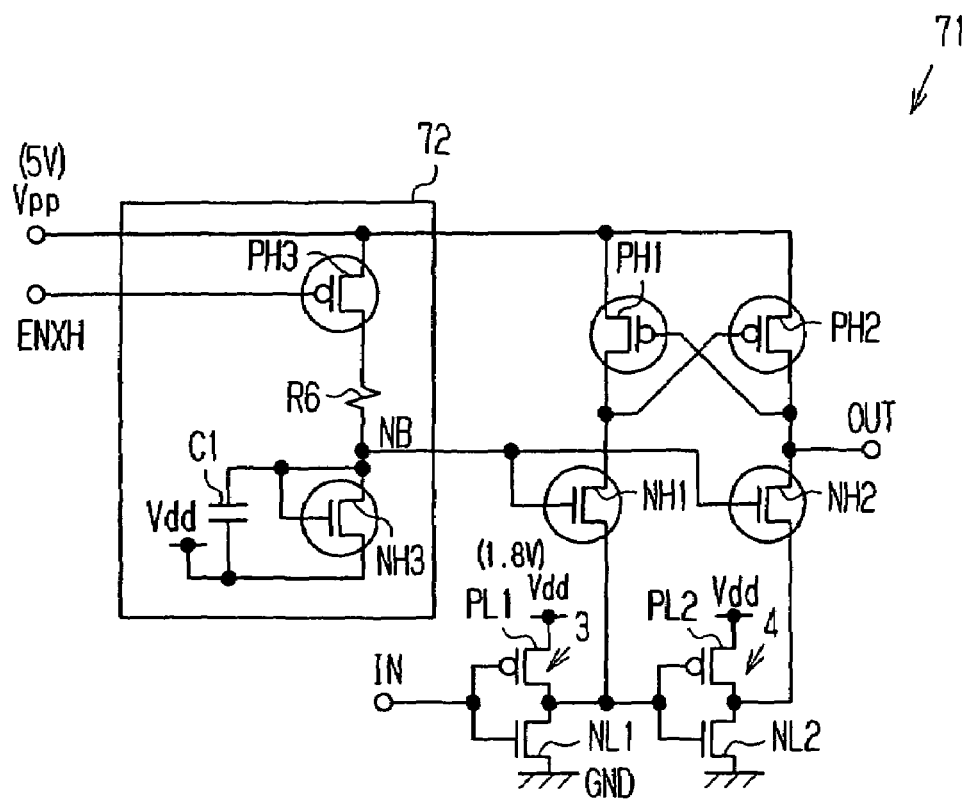
FIG. 26 is a schematic circuit diagram showing a level conversion circuit according to a fifteenth embodiment of the present invention.

FIG. 26 shows a level conversion circuit 71 of the fifteenth embodiment. The structures of the MOS transistors PH1, PH2, NH1, NH2, and inverter circuits 3 and 4 which form the level conversion circuit 71, are identical to that of the first embodiment, with the exception of the bias circuit 72.

The bias circuit 72 is controlled by a 5 V control signal ENXH supplied from the level conversion circuit 62 (refer to FIG. 25). More specifically, the bias circuit 72 includes a PMOS transistor PH3, an NMOS transistor NH3, a resistor R6, and a capacitor C1. In the bias circuit 72, when an L level (0 V) control signal ENXH is supplied to the gate of the PMOS transistor PH3, the PMOS transistor PH3 is turned on, and a bias current flows through the resistor R6 to the NMOS transistor NH3. When an H level (5 V) control signal ENXH is supplied to the gate of the PMOS transistor PH3, the PMOS transistor PH3 is turned off, and the bias current stops flowing.

The 5 V control signal ENXH is generated based on the 1.8 V control signal EN by the level conversion circuit 62 of FIG. 25. Thus, the fifteenth embodiment has the same advantages as the first embodiment.

It should be apparent to those skilled in the art that the present invention may be embodied in many other specific forms without departing from the spirit or scope of the invention. Particularly, it should be understood that the invention may be embodied in the following forms.

The level conversion circuit of another embodiment may be used in place of the level conversion circuit 10 in the AD conversion circuit 15 of the second embodiment. The level conversion circuits of each embodiment also may be used in semiconductor integrated circuit devices other than an AD conversion circuit.

The power ON reset circuit 44 of the ninth embodiment may also be provided in the level conversion circuit of another embodiment. The power ON reset circuit 44 of the ninth embodiment includes the PMOS transistor PH31, the resistor RPOR, and the capacitor CPOR. However, the configuration of the power ON reset circuit 44 may be modified as required.

Therefore, the present examples and embodiments are to be considered as illustrative and not restrictive and the invention is not to be limited to the details given herein, but may be modified within the scope and equivalence of the appended claims.

What is claimed is:

1. A level conversion circuit for receiving an input signal having a first voltage and generating an output signal having a second voltage that is greater than the first voltage, the level conversion circuit comprising:
   a first NMOS transistor including a drain;
   a second NMOS transistor including a drain;
   a first PMOS transistor including a drain, a gate, and a source, the drain of the first PMOS transistor being connected to the drain of the first NMOS transistor, and the gate of the first PMOS transistor being connected to the drain of the second NMOS transistor;
   a second PMOS transistor including a drain, a gate, and a source, the gate of the second PMOS transistor being connected to the drain of the first NMOS transistor, and the drain of the second PMOS transistor being connected to the drain of the second NMOS transistor;
   a third PMOS transistor including a drain and a gate, the drain of the third PMOS transistor being connected to the source of the first PMOS transistor;
   a fourth PMOS transistor including a drain and a gate, the drain of the fourth PMOS transistor being connected to the source of the second PMOS transistor; and
   a bias circuit connected to the gates of the third and fourth PMOS transistors, the bias circuit generating a bias potential that is supplied to the gates of the third and fourth PMOS transistors so that currents flowing to the third and fourth PMOS transistors are respectively proportional to currents flowing to the first and second NMOS transistors and at least the current flowing to the second NMOS transistor is larger than the current flowing to the second PMOS transistor when the first voltage decreases.

2. The level conversion circuit according to claim 1, wherein the bias circuit includes a MOS transistor for setting the bias potential as a reference voltage.

3. The level conversion circuit according to claim 1, wherein the bias circuit includes a capacitor for stabilizing the bias potential.

4. The level conversion circuit according to claim 1 further comprising:
   a control circuit for generating a control signal to control bias current in the bias circuit.

5. The level conversion circuit according to claim 4, wherein the control circuit comprises an inverter circuit.

6. A level conversion circuit for receiving an input signal having a first voltage and generating an output signal having a second voltage that is greater than the first voltage, the level conversion circuit comprising:
   a bias circuit for generating a bias potential;
   cross-coupled first and second PMOS transistors;
   a first NMOS transistor connected to the first PMOS transistor;
   a second NMOS transistor connected to the second PMOS transistor;
   a third PMOS transistor, connected to the bias circuit and the first PMOS transistor, for restricting current flowing to the first PMOS transistor in accordance with the bias potential;
   a fourth PMOS transistor, connected to the bias circuit and the second PMOS transistor, for restricting current flowing to the second PMOS transistor in accordance with the bias potential, the bias circuit generating a bias potential so that currents flowing to the third and fourth PMOS transistors are respectively proportional to currents flowing to the first and second NMOS transistors and at least the current flowing to the second NMOS transistor is larger than the current flowing to the second PMOS transistor when the first voltage decreases.

7. The level conversion circuit according to claim 6, wherein the bias circuit includes a MOS transistor for setting the bias potential as a reference voltage.

8. The level conversion circuit according to claim 6, wherein the bias circuit includes a capacitor for stabilizing the bias potential.

9. The level conversion circuit according to claim 6 further comprising:
   a control circuit for generating a control signal to control bias current in the bias circuit.

10. The level conversion circuit according to claim 9, wherein the control circuit comprises an inverter circuit.

11. A level conversion circuit for receiving an input signal having a first voltage and generating an output signal having a second voltage that is greater than the first voltage, the level conversion circuit comprising:
    a first NMOS transistor including a drain;
    a second NMOS transistor including a drain;
    a first PMOS transistor including a drain, a gate, and a source, the drain of the first PMOS transistor being connected to the drain of the first NMOS transistor, and the gate of the first PMOS transistor being connected to the drain of the second NMOS transistor;
    a second PMOS transistor including a drain, a gate, and a source, the gate of the second PMOS transistor being connected to the drain of the first NMOS transistor, and the drain of the second PMOS transistor being connected to the drain of the second NMOS transistor;
    a third PMOS transistor including a drain and a gate, the drain of the third PMOS transistor being connected to the source of the first PMOS transistor;
    a fourth PMOS transistor including a drain and a gate, the drain of the fourth PMOS transistor being connected to the source of the second PMOS transistor; and
    a bias circuit connected to the third and fourth PMOS transistors, the bias circuit including;
    a fifth PMOS transistor including a source supplied with the second voltage, a gate connected to the gates of the third and fourth PMOS transistors; and
    a third NMOS transistor including a source supplied with a reference voltage, a gate for receiving a control signal having the first voltage, a drain connected to the drain of the fifth PMOS transistor, and a gate connected to the fifth PMOS transistor,
    wherein the bias circuit includes a capacitor connected between the gate and the source of the fifth PMOS transistor.

12. The level conversion circuit according to claim 11, wherein the bias circuit generates a bias potential that is supplied to the gates of the third and fourth PMOS transistors so that currents flowing to the third and fourth PMOS transistors are respectively proportional to currents flowing to the first and second NMOS transistors.

13. The level conversion circuit according to claim 11 further comprising:
    a control circuit for generating a control signal to control bias current in the bias circuit.

14. The level conversion circuit according to claim 13, wherein the control circuit comprises an inverter circuit.

* * * * *